United States Patent
Terrill et al.

(10) Patent No.: US 10,546,840 B2
(45) Date of Patent: Jan. 28, 2020

(54) METHOD FOR FABRICATING STACK DIE PACKAGE

(71) Applicant: VISHAY-SILICONIX, Santa Clara, CA (US)

(72) Inventors: Kyle Terrill, Santa Clara, CA (US); Frank Kuo, Kaohsiung (TW); Sen Mao, Kaohsiung (TW)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 15/439,817

(22) Filed: Feb. 22, 2017

(65) Prior Publication Data

US 2017/0162403 A1 Jun. 8, 2017

Related U.S. Application Data

(62) Division of application No. 13/830,041, filed on Mar. 14, 2013, now Pat. No. 9,589,929.

(51) Int. Cl.
*H01L 25/07* (2006.01)
*H01L 23/495* (2006.01)
(Continued)

(52) U.S. Cl.
CPC ........ *H01L 25/074* (2013.01); *H01L 21/4853* (2013.01); *H01L 21/565* (2013.01);
(Continued)

(58) Field of Classification Search
CPC .............. H01L 21/4853; H01L 21/565; H01L 23/49513; H01L 23/49541; H01L 25/074; H01L 2224/48245; H01L 2224/3245; H01L 2224/90; H01L 2224/72; H01L 23/49575; H01L 23/3157; H01L 23/433; H01L 23/49568; H01L 23/3675; H01L 23/49844; H01L 21/566
See application file for complete search history.

(56) References Cited

U.S. PATENT DOCUMENTS

| | | |
|---|---|---|
| 5,098,626 A | 3/1992 | Pas |
| 5,304,831 A | 4/1994 | Yilmaz et al. |

(Continued)

FOREIGN PATENT DOCUMENTS

| | | |
|---|---|---|
| CN | 100435324 C | 11/2008 |
| CN | 102714201 | 10/2012 |

(Continued)

OTHER PUBLICATIONS

Kyle Terrill et al., U.S. Appl. No. 13/830,041, "Methodfor Fabricating Stack Die Package", filed Mar. 14, 2013.

*Primary Examiner* — Sophia T Nguyen

(57) ABSTRACT

In one embodiment, a method can include coupling a gate and a source of a first die to a lead frame. The first die can include the gate and the source that are located on a first surface of the first die and a drain that is located on a second surface of the first die that is opposite the first surface. In addition, the method can include coupling a source of a second die to the drain of the first die. The second die can include a gate and the source that are located on a first surface of the second die and a drain that is located on a second surface of the second die that is opposite the first surface.

20 Claims, 21 Drawing Sheets

(51) Int. Cl.
  *H01L 23/00*     (2006.01)
  *H01L 23/31*     (2006.01)
  *H01L 21/48*     (2006.01)
  *H01L 21/56*     (2006.01)
  *H01L 23/498*    (2006.01)
  *H01L 23/544*    (2006.01)

(52) U.S. Cl.
  CPC ........ *H01L 21/566* (2013.01); *H01L 23/3107* (2013.01); *H01L 23/3157* (2013.01); *H01L 23/49513* (2013.01); *H01L 23/49524* (2013.01); *H01L 23/49541* (2013.01); *H01L 23/49568* (2013.01); *H01L 23/49575* (2013.01); *H01L 23/49844* (2013.01); *H01L 24/41* (2013.01); *H01L 24/49* (2013.01); *H01L 24/73* (2013.01); *H01L 24/83* (2013.01); *H01L 24/84* (2013.01); *H01L 24/92* (2013.01); *H01L 23/544* (2013.01); *H01L 24/27* (2013.01); *H01L 24/29* (2013.01); *H01L 24/32* (2013.01); *H01L 24/33* (2013.01); *H01L 24/37* (2013.01); *H01L 24/40* (2013.01); *H01L 24/48* (2013.01); *H01L 24/85* (2013.01); *H01L 2223/54486* (2013.01); *H01L 2224/2732* (2013.01); *H01L 2224/27318* (2013.01); *H01L 2224/291* (2013.01); *H01L 2224/293* (2013.01); *H01L 2224/2929* (2013.01); *H01L 2224/29294* (2013.01); *H01L 2224/32245* (2013.01); *H01L 2224/33181* (2013.01); *H01L 2224/37147* (2013.01); *H01L 2224/40095* (2013.01); *H01L 2224/40245* (2013.01); *H01L 2224/40499* (2013.01); *H01L 2224/411* (2013.01); *H01L 2224/4103* (2013.01); *H01L 2224/4118* (2013.01); *H01L 2224/41051* (2013.01); *H01L 2224/41052* (2013.01); *H01L 2224/41105* (2013.01); *H01L 2224/48091* (2013.01); *H01L 2224/48105* (2013.01); *H01L 2224/48245* (2013.01); *H01L 2224/48247* (2013.01); *H01L 2224/49052* (2013.01); *H01L 2224/49105* (2013.01); *H01L 2224/73263* (2013.01); *H01L 2224/73265* (2013.01); *H01L 2224/73271* (2013.01); *H01L 2224/8391* (2013.01); *H01L 2224/83191* (2013.01); *H01L 2224/83192* (2013.01); *H01L 2224/83815* (2013.01); *H01L 2224/83851* (2013.01); *H01L 2224/8485* (2013.01); *H01L 2224/8491* (2013.01); *H01L 2224/84815* (2013.01); *H01L 2224/9221* (2013.01); *H01L 2224/92246* (2013.01); *H01L 2224/92252* (2013.01); *H01L 2924/00014* (2013.01); *H01L 2924/00015* (2013.01); *H01L 2924/12042* (2013.01); *H01L 2924/1306* (2013.01); *H01L 2924/13091* (2013.01); *H01L 2924/181* (2013.01)

(56) References Cited

U.S. PATENT DOCUMENTS

| | | | |
|---|---|---|---|
| 5,316,959 A | 5/1994 | Kwan et al. | |
| 5,430,324 A | 7/1995 | Bencuya | |
| 5,608,260 A * | 3/1997 | Carper | H01L 23/4951 257/666 |
| 5,710,064 A | 1/1998 | Song et al. | |
| 5,804,468 A | 9/1998 | Tsuji et al. | |
| 6,028,352 A | 2/2000 | Eide | |
| 6,246,115 B1 | 6/2001 | Tang et al. | |
| 6,274,905 B1 | 8/2001 | Mo | |
| 6,285,058 B1 | 9/2001 | Narazaki et al. | |
| 6,285,075 B1 | 9/2001 | Combs et al. | |
| 6,307,755 B1 | 10/2001 | Williams et al. | |
| 6,319,828 B1 | 11/2001 | Jeong et al. | |
| 6,351,018 B1 | 2/2002 | Sapp | |
| 6,429,481 B1 | 8/2002 | Mo et al. | |
| 6,432,750 B2 | 8/2002 | Jeon et al. | |
| 6,475,834 B2 | 11/2002 | Embong et al. | |
| 6,580,161 B2 | 6/2003 | Kobayakawa | |
| 6,613,607 B2 | 9/2003 | Janssen et al. | |
| 6,652,799 B2 | 11/2003 | Seng et al. | |
| 6,654,248 B1 | 11/2003 | Fishley et al. | |
| 6,700,793 B2 | 3/2004 | Takagawa et al. | |
| 6,777,800 B2 | 8/2004 | Madrid et al. | |
| 6,849,930 B2 | 2/2005 | Nakajima et al. | |
| 6,873,041 B1 | 3/2005 | Crowley et al. | |
| 6,891,256 B2 | 5/2005 | Joshi et al. | |
| 7,071,033 B2 | 7/2006 | Estacio | |
| 7,132,734 B2 | 11/2006 | Johnson | |
| 7,238,551 B2 | 7/2007 | Kasem et al. | |
| 7,271,470 B1 | 9/2007 | Otremba | |
| 7,271,477 B2 | 9/2007 | Saito et al. | |
| 7,394,150 B2 | 7/2008 | Kasem et al. | |
| 7,595,017 B2 | 9/2009 | Siegel et al. | |
| 7,768,108 B2 | 8/2010 | Liu et al. | |
| 7,842,541 B1 | 11/2010 | Rusli et al. | |
| 7,902,646 B2 | 3/2011 | Liu et al. | |
| 8,018,054 B2 | 9/2011 | Liu et al. | |
| 8,026,589 B1 | 9/2011 | Kim et al. | |
| 8,358,014 B2 | 1/2013 | Koduri | |
| 8,358,017 B2 | 1/2013 | Tsui | |
| 8,426,952 B2 | 4/2013 | Cho et al. | |
| 8,461,669 B2 | 6/2013 | Yang et al. | |
| 8,513,784 B2 | 8/2013 | Lu et al. | |
| 8,581,376 B2 | 11/2013 | Yilmaz et al. | |
| 8,586,419 B2 | 11/2013 | Jaunay et al. | |
| 8,604,597 B2 | 12/2013 | Jiang | |
| 8,822,273 B2 | 9/2014 | Kuo et al. | |
| 8,952,509 B1 | 2/2015 | Yilmaz et al. | |
| 8,958,509 B1 | 2/2015 | Wiegand | |
| 9,024,423 B2 | 5/2015 | Muto et al. | |
| 9,048,338 B2 | 6/2015 | Hosseini et al. | |
| 9,184,152 B2 | 11/2015 | Kuo et al. | |
| 9,425,305 B2 | 8/2016 | Terrill et al. | |
| 9,595,503 B2 | 3/2017 | Kuo et al. | |
| 9,966,330 B2 | 5/2018 | Terrill et al. | |
| 2001/0000924 A1* | 5/2001 | Karnezos | H01L 23/4334 257/666 |
| 2001/0052641 A1 | 12/2001 | Kuo et al. | |
| 2003/0042556 A1 | 3/2003 | Gajda et al. | |
| 2004/0063240 A1 | 4/2004 | Madrid et al. | |
| 2004/0070352 A1 | 4/2004 | Shen | |
| 2004/0157372 A1* | 8/2004 | Manatad | H01L 23/49844 438/108 |
| 2004/0188699 A1 | 9/2004 | Kameyama et al. | |
| 2004/0256703 A1 | 12/2004 | Tu et al. | |
| 2005/0077617 A1* | 4/2005 | Hirano | H01L 23/4334 257/712 |
| 2005/0139982 A1 | 6/2005 | Fukaya et al. | |
| 2005/0146058 A1 | 7/2005 | Danno | |
| 2005/0260404 A1 | 11/2005 | Iwade et al. | |
| 2006/0017143 A1 | 1/2006 | Shimanuki et al. | |
| 2006/0169796 A1 | 8/2006 | Kameda et al. | |
| 2006/0169976 A1 | 8/2006 | Kameda et al. | |
| 2007/0096337 A1 | 5/2007 | Choi | |
| 2007/0108575 A1 | 5/2007 | Montgomery | |
| 2007/0114352 A1 | 5/2007 | Cruz et al. | |
| 2007/0132073 A1 | 6/2007 | Tiong et al. | |
| 2007/0132079 A1 | 6/2007 | Otremba et al. | |
| 2007/0262346 A1 | 11/2007 | Otremba et al. | |
| 2007/0278571 A1 | 12/2007 | Bhalla et al. | |
| 2008/0048301 A1 | 2/2008 | Wang et al. | |
| 2008/0122071 A1 | 5/2008 | Tseng et al. | |
| 2008/0211070 A1 | 9/2008 | Sun et al. | |
| 2008/0217753 A1 | 9/2008 | Otani | |
| 2008/0233679 A1 | 9/2008 | Luo et al. | |
| 2008/0246130 A1* | 10/2008 | Carney | H01L 23/4334 257/675 |
| 2009/0008759 A1 | 1/2009 | Yoshino | |
| 2009/0039484 A1 | 2/2009 | Mahler et al. | |
| 2009/0057852 A1 | 3/2009 | Madrid | |

(56) References Cited

U.S. PATENT DOCUMENTS

| | | |
|---|---|---|
| 2009/0057855 A1 | 3/2009 | Quinones et al. |
| 2009/0057869 A1* | 3/2009 | Hebert .................... H01L 24/40 257/691 |
| 2009/0108467 A1 | 4/2009 | Otremba |
| 2009/0121331 A1 | 5/2009 | Cruz |
| 2009/0130799 A1 | 5/2009 | Havanur |
| 2009/0224383 A1 | 9/2009 | Cruz et al. |
| 2009/0294934 A1 | 12/2009 | Shi et al. |
| 2010/0133670 A1* | 6/2010 | Liu .................... H01L 23/49524 257/675 |
| 2010/0148346 A1 | 6/2010 | Quinones et al. |
| 2010/0164078 A1* | 7/2010 | Madrid ............... H01L 23/3107 257/675 |
| 2010/0171543 A1 | 7/2010 | Korec et al. |
| 2010/0295160 A1 | 11/2010 | Liu et al. |
| 2010/0301496 A1 | 12/2010 | Koduri |
| 2011/0024917 A1 | 2/2011 | Bhalla et al. |
| 2011/0074016 A1* | 3/2011 | Narita .................. H01L 21/4821 257/737 |
| 2011/0089485 A1 | 4/2011 | Gao et al. |
| 2011/0095411 A1 | 4/2011 | Herbsommer et al. |
| 2011/0108965 A1* | 5/2011 | Hess .................... H01L 21/4842 257/676 |
| 2011/0175217 A1 | 7/2011 | Jaunay et al. |
| 2011/0198739 A1 | 8/2011 | Amanai et al. |
| 2011/0210406 A1 | 9/2011 | Trerrill et al. |
| 2011/0227207 A1 | 9/2011 | Yilmaz et al. |
| 2011/0316135 A1 | 12/2011 | Urushihata |
| 2011/0316156 A1 | 12/2011 | Pagaila et al. |
| 2012/0049336 A1 | 3/2012 | Xue et al. |
| 2012/0112331 A1 | 5/2012 | Kuo et al. |
| 2012/0119343 A1* | 5/2012 | Bayan ................. H01L 21/4842 257/676 |
| 2012/0126323 A1 | 5/2012 | Wu et al. |
| 2012/0146202 A1 | 6/2012 | Xue et al. |
| 2012/0181674 A1 | 7/2012 | Cho et al. |
| 2012/0200281 A1 | 8/2012 | Herbsommer et al. |
| 2012/0248539 A1 | 10/2012 | Zhang et al. |
| 2012/0280308 A1 | 11/2012 | Disney |
| 2012/0292753 A1 | 11/2012 | Cho |
| 2012/0326287 A1* | 12/2012 | Joshi .................. H01L 23/49524 257/676 |
| 2013/0221511 A1 | 8/2013 | Higgins, III et al. |
| 2013/0113114 A1 | 9/2013 | Hosseini et al. |
| 2013/0256852 A1 | 10/2013 | Wyant et al. |
| 2014/0061884 A1 | 3/2014 | Carpenter et al. |
| 2014/0063744 A1 | 3/2014 | Lopez et al. |
| 2014/0077352 A1 | 3/2014 | Leal et al. |
| 2014/0084429 A1 | 3/2014 | Chen et al. |
| 2014/0117523 A1* | 5/2014 | Ho ...................... H01L 23/4952 257/676 |
| 2014/0191334 A1 | 7/2014 | Xue et al. |
| 2014/0264611 A1 | 9/2014 | Lee et al. |
| 2014/0264804 A1 | 9/2014 | Terrill et al. |
| 2014/0273344 A1 | 9/2014 | Terrill et al. |
| 2014/0370661 A1 | 12/2014 | Kuo et al. |
| 2015/0001618 A1 | 1/2015 | Hebert |
| 2015/0035129 A1 | 2/2015 | Zhang et al. |
| 2016/0093560 A1* | 3/2016 | Huo .................. H01L 23/49541 257/676 |
| 2016/0118320 A1 | 4/2016 | Coppone et al. |
| 2016/0260697 A1 | 8/2016 | Cho et al. |

FOREIGN PATENT DOCUMENTS

| | | |
|---|---|---|
| DE | 102012110494 | 5/2013 |
| EP | 1009035 | 6/2000 |
| EP | 2477221 | 7/2012 |
| JP | 2002217416 | 8/2002 |
| JP | 2006216940 | 8/2006 |
| JP | 2008235589 | 10/2008 |
| JP | 2010034350 | 2/2010 |
| JP | 2010109255 | 5/2010 |
| JP | 2010283236 | 12/2010 |
| JP | 2013508980 | 3/2013 |
| KR | 1020110097925 | 8/2011 |
| KR | 1020120125462 | 11/2012 |
| TW | 200949966 | 12/2009 |
| WO | 9965062 | 12/1999 |

* cited by examiner

METHOD FOR FABRICATING STACK DIE PACKAGE

CROSS REFERENCE TO RELATED APPLICATIONS

This is a divisional application of co-pending U.S. patent application Ser. No. 13/830,041, now U.S. Pat. No. 9,589,929, entitled "Method for Fabricating Stack Die Package", by Kyle Terrill et al., filed Mar. 14, 2013, which is hereby incorporated by reference.

This application is related to U.S. patent application Ser. No. 13/829,623, entitled "Stack Die Package," by Kyle Terrill et al., which was filed on Mar. 14, 2013.

BACKGROUND

In DC-DC power supplies, the co-packaging of both the control and synchronous MOSFET (metal-oxide semiconductor field-effect transistor) devices in a single package has better area efficiency and is currently the trend within the industry. FIGS. 1, 2, and 3 illustrate different examples of these types of die packages that are available within the market. Specifically, FIG. 1 is an isometric view of a conventional PPAIR package 100 that includes two dies together with wire bonding. The wire bonding is illustrated by a magnified view 102. In addition, FIG. 2 illustrates top and bottom views of a conventional PPAIR package 200 that includes two dies together with clip bonding. The clip bonding is illustrated by a magnified view 202. Furthermore, FIG. 3 is an isometric view of a conventional stack die package 300 that includes two stacked dies along with clips. It is pointed out that there are disadvantages associated with these conventional die packages.

For example, for a PPAIR package (e.g., 100 or 200), the LS (low side) die and the HS (high side) die are situated near each other on the same surface. As such, for a given fixed package size, the die size within the PPAIR package will be limited and therefore the drain-to-source resistance (Rds) and current handling capability will be affected. It is pointed out that for a stack die package (e.g., 300), the die size can be larger. However, due to the soldering process of the clips, it can contaminate the wire bond pad surfaces on the die and lead post. Consequently, there is a concern about the assembly yield and the reliability of the bonded wires of stack die packages. Furthermore, the wire bonding process of a stack die package can require silver plating on the lead frame which adversely increases the lead frame cost.

SUMMARY

Various embodiments in accordance with the invention can address the disadvantages described above that are associated with typical conventional die packages.

In one embodiment, a method can include coupling a gate and a source of a first die to a lead frame. The first die can include the gate and the source that are located on a first surface of the first die and a drain that is located on a second surface of the first die that is opposite the first surface. In addition, the method can include coupling a source of a second die to the drain of the first die. The second die can include a gate and a drain that are located on a first surface of the second die and the source that is located on a second surface of the second die that is opposite the first surface.

In another embodiment, a method can include coupling a gate and a source of a first die to a lead frame. The first die can include the gate and the source that are located on a first surface of the first die and a drain that is located on a second surface of the first die that is opposite the first surface. Furthermore, the method can include coupling a source of a second die to the drain of the first die. The second die can include a gate and the source that are located on a first surface of the second die and a drain that is located on a second surface of the second die that is opposite the first surface.

In yet another embodiment, a method can include coupling a gate and a source of a first die to a lead frame. The first die can include the gate and the source that are located on a first surface of the first die and a drain that is located on a second surface of the first die that is opposite the first surface. Additionally, the method can include coupling a source of a second die to the drain of the first die. The second die can include a gate and a drain that are located on a first surface of the second die and the source that is located on a second surface of the second die that is opposite the first surface. Moreover, the method can include coupling a first clip and a second clip to the second die at approximately the same time.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the invention can be implemented in conjunction with these other (perhaps conventional) processes and steps without significantly perturbing them. Generally speaking, embodiments in accordance with the invention can replace portions of a conventional process without significantly affecting peripheral processes and steps.

Figure 1:
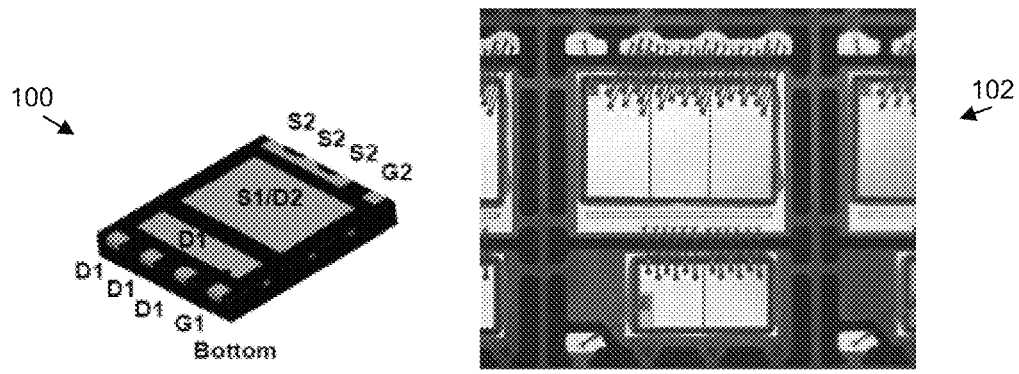
FIG. 1 includes a perspective view and magnified view of a conventional PPAIR package with wire bonding.
Figure 2:
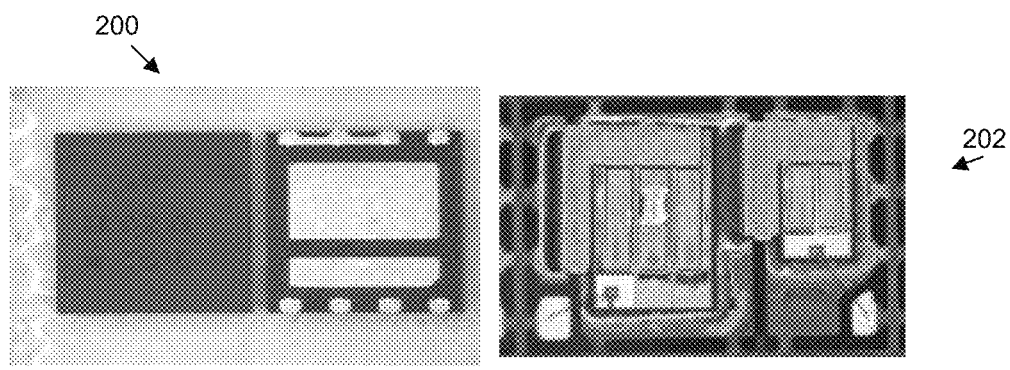
FIG. 2 includes a top view, bottom view, and magnified view of a conventional PPAIR package with clip bonding.
Figure 3:
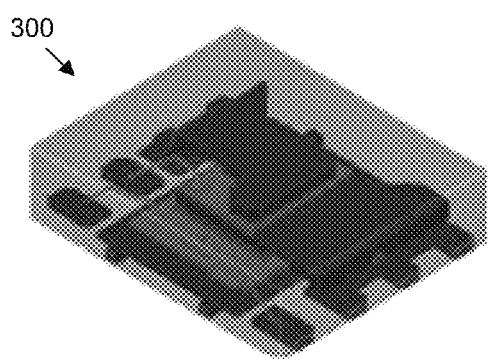
FIG. 3 is an isometric view of a conventional stack die package.
Figure 4:
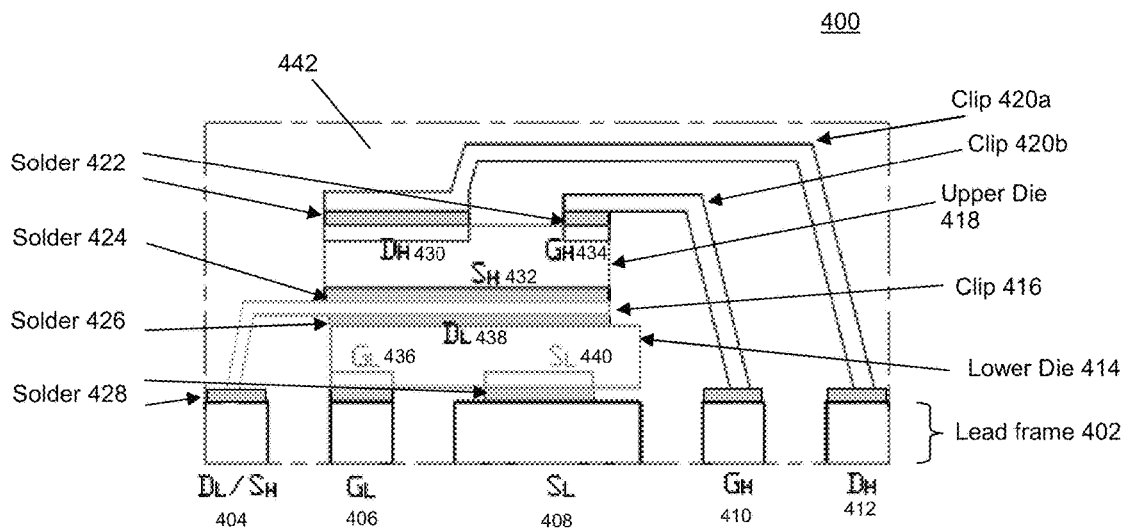
FIG. 4 is a side sectional view of a stack die package in accordance with various embodiments of the invention.

FIG. 4 is a side sectional view of a stack die package 400 in accordance with various embodiments of the invention. In an embodiment, the stack die package 400 can include a lower die or chip 414 that has a die construction with a source contact 440 and a gate contact 436 located on or as part of its top surface and a drain contact 438 located on or as part of its bottom surface. The lower die 414 can be flip chip attached or coupled to a lead frame 402 such that both the source contact 440 and the gate contact 436 are coupled or connected with the lead frame 402. When coupled in this manner, this allows both the lower die 414 and an upper die 418 to share the same lead frame 402, simplifies the design of the package 400, and reduces the footprint of the package 400. It is noted that in an embodiment, this flip chip on lead frame technique eliminates the need to do wire bonding on the lower die 414. In addition, since the source area 440 is coupled or connected to the lead frame 402, the heat generated by the source contact 440 can dissipate to the lead frame 402 and the printed circuit board (PCB) circuit paths.

In one embodiment, the upper die or chip 418 can be implemented with, but is not limited to, a LDMOS (Laterally Diffused Metal Oxide Semiconductor) construction or technology which has a drain contact 430 and a gate contact 434 located on or as part of its top surface and a source contact 432 located on or as part of its bottom surface. In an embodiment, the lower die 414 can be implemented with trench or split gate technology, but is not limited to such. It is pointed out that if the lower die 414 is implemented with the trench or split gate technology, the lower die 414 will have less than half the total resistance per unit area of the upper die 418 when implemented with LDMOS technology.

Within FIG. 4, in one embodiment, the stack die package 400 can include bigger clip 420*a* and a smaller clip 420*b*. On the top surface of the upper die 418, in an embodiment, the bigger clip 420*a* can be coupled or attached to the drain contact area 430 and the smaller clip 420*b* can be coupled or attached to the gate contact area 434. In one embodiment, the clips 420*a* and 420*b* can actually be manufactured as part of one clip frame (not shown). In addition, the clips 420*a* and 420*b* can also be attached to the surface of the upper die 418 at the same time or approximately the same time. It is noted that in an embodiment, the clips 420*a* and 420*b* can have tie bars (not shown) to the clip frame thereby enabling them to be handled at the same time. Note that in one embodiment, the stack die package 400 can be implemented as, but is not limited to, a QFN (quad-flat no-leads) type of package. As such, during the assembly process of multiple stack die package (e.g., similar to 400), there is a package saw operation utilized to separate all the units from each other. The tie bars of the clips 420*a* and 420*b* are designed such that when doing the package saw operation, the tie bars are sawed or cut automatically. Since the saw operation is done after the molding process, the separated clips 420*a* and 420*b* will be held in place by a mold compound 442 of the stack die package 400.

It is noted that there are several advantages to the stack die package 400. For example, in an embodiment, any type of wire bonding can be eliminated from the stack die package 400. As such, the stack die package 600 is free of wire bonding. In addition, in one embodiment, the flip chip of the lower die 414 allows a larger contact area between the drain area 438 and the clip 416, which can provide the possibility of a larger die size of the upper die 418. Furthermore, in an embodiment, utilizing the clip 420*b* eliminates the need to do wire bonding on the gate contact 434 of the upper die 418. As such, there is no need to do silver plating on the lead frame 402. Moreover, in one embodiment, the wire bonding can be eliminated in the assembly process of the stack die package 400. Consequently, the assembly cost of the stack die package 400 is reduced.

Within FIG. 4, it is noted that the stack die package 400 and its components can be implemented in a wide variety of ways. For example, in various embodiments, the clips 420*a* and 420*b* can be implemented in any manner similar to that described and shown within U.S. patent application Ser. No. 13/229,667, now U.S. Pat. No. 8,822,273, entitled "Dual Lead Frame Semiconductor Package and Method of Manufacture," by Frank Kuo et al., filed Sep. 9, 2011, which is hereby incorporated by reference. In an embodiment, note that the stack die package 400 can be implemented as a power MOSFET package, but is not limited to such. It is pointed out that the clips 420a, 420b, and 416 can each be implemented in a wide variety of ways. For example, in various embodiments, the clips 420a, 420b, and 416 can each be implemented with one or more electrically conductive materials (e.g., one or more metals, such as copper).

In an embodiment, the lead frame 402 can include, but is not limited to, a $D_L/S_H$ lead 404 for coupling to both the drain ($D_L$) 438 of the lower die 414 and the source ($S_H$) 432 of the upper die 418. In addition, the lead frame 402 can include, but is not limited to, a $G_L$ lead 406 for coupling to the gate 436 of the lower die 414, a $S_L$ lead 408 for coupling to the source 440 of the lower die 414, a $G_H$ lead 410 for coupling to the gate 434 of the upper die 418, and a $D_H$ lead 412 for coupling to the drain 430 of the upper die 418. The gate contact 436 of the lower die 414 can be coupled to the lead 406 via solder paste 428 while the source contact 440 can be coupled to the lead 408 via solder paste 428. Furthermore, the clip 416 can be coupled to the lead 404. Moreover, the clip 416 can be coupled to both the drain contact 438 of the lower die 414 via solder paste 426 and to the source contact 432 of the upper die 418 via solder paste 424. In this manner, the source contact 432, the drain contact 438, and the lead 404 can be coupled together. As such, in an embodiment, the clip 416 can provide a high current path between the source contact 432 and the drain contact 438. Additionally, the clip 416 can provide a high current path to the lead 404 for the source contact 432 and the drain contact 438.

Within FIG. 4, the clip 420a can be coupled to the lead 412. In addition, the clip 420a can be coupled to the drain contact 430 of the upper die 418 via solder paste 422. Additionally, the clip 420b can be coupled to the lead 410. Moreover, the clip 420b can be coupled to the gate contact 434 of the upper die 418 via solder paste 422. It is noted that within the present embodiment, the lower die 414 is located above the lead frame 402 while the upper die 418 is located above the lower die 414. In this manner, the upper die 418 is stacked above the lower die 414, which is coupled to the lead frame 402. In one embodiment, the stack die package 400 can include molding 442 that covers and/or encapsulates the clips 416, 420a, and 420b, the upper die 418, the lower die 414, the solder pastes 422, 424, 426, and 428, and portions of the lead frame 402. In various embodiments, it is noted that one or more of the solder pastes 422, 424, 426, and 428 can instead be implemented with a conductive epoxy or conductive adhesive, but is not limited to such.

It is noted that the stack die package 400 may not include all of the elements illustrated by FIG. 4. In addition, the stack die package 400 can be implemented to include one or more elements not illustrated by FIG. 4. It is pointed out that the stack die package 400 can be utilized or implemented in any manner similar to that described herein, but is not limited to such.

Figure 5:
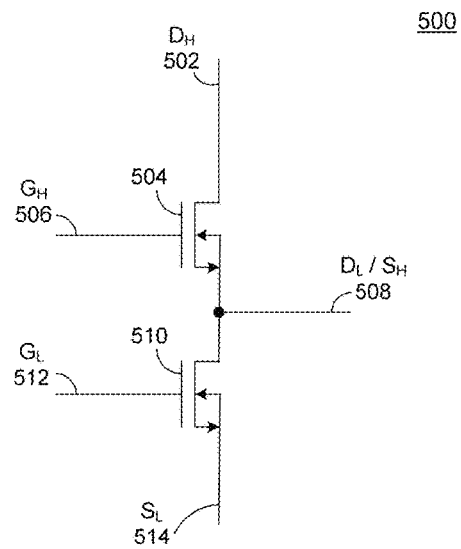
FIG. 5 is a schematic diagram of a circuit in accordance with various embodiments of the invention.

FIG. 5 is a schematic diagram of a circuit 500 representing the structure of a stack die package (e.g., 400 or 600) in accordance with various embodiments of the invention. The circuit 500 can include a transistor (e.g., NMOS) 504 that represents the upper die (e.g., 418 or 618) within the stack die package and a transistor (e.g., NMOS) 510 that represents the lower die (e.g., 414 or 614) within the stack die package. In addition, the drain of the transistor 504 can be coupled to a $D_H$ lead 502 of a lead frame (e.g., 402 or 602) and the gate of the transistor 504 can be coupled to a $G_H$ lead 504 of the lead frame. The source of the transistor 504 and the drain of the transistor 510 can both be coupled to a $D_L/S_H$ lead 508 of the lead frame. Furthermore, the gate of the transistor 510 can be coupled to a $G_L$ lead 512 of the lead frame and the source of the transistor 510 can be coupled to a $S_L$ lead 514 of the lead frame.

It is pointed out that the circuit 500 may not include all of the elements illustrated by FIG. 5. Additionally, the circuit 500 can be implemented to include one or more elements not illustrated by FIG. 5. It is noted that the circuit 500 can be utilized or implemented in any manner similar to that described herein, but is not limited to such.

Figure 6:
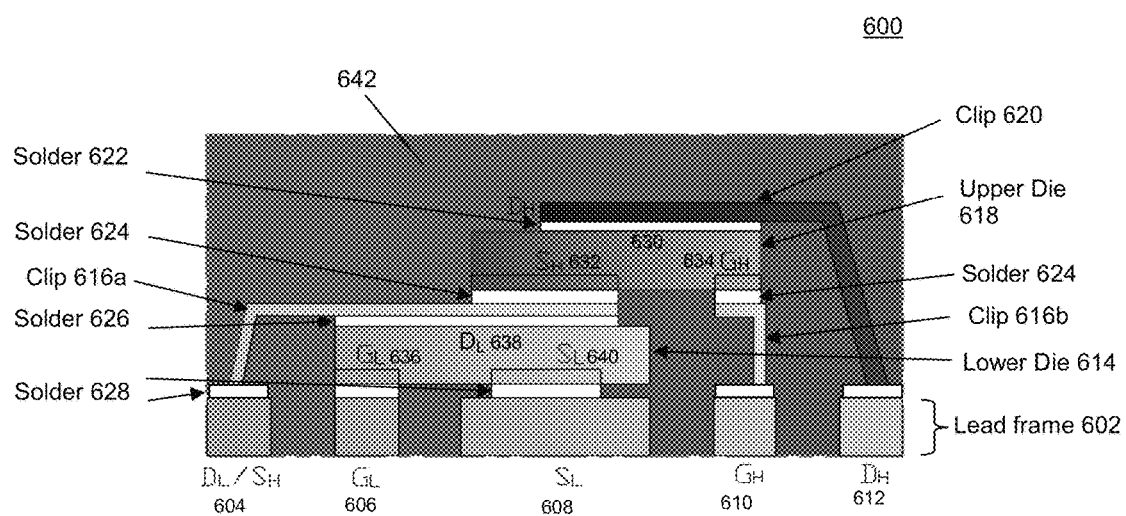
FIG. 6 is a side sectional view of another stack die package in accordance with various embodiments of the invention.

FIG. 6 is a side sectional view of a stack die package 600 in accordance with various embodiments of the invention. In one embodiment, the stack die package 600 can include a lower die or chip 614 that has a die construction with a source contact 640 and a gate contact 636 located on or as part of its top surface and a drain contact 638 located on or as part of its bottom surface. The lower die 614 can be flip chip attached or coupled to a lead frame 602 such that both the source contact 640 and the gate contact 636 are coupled or connected with the lead frame 602. When coupled in this fashion, this allows both the lower die 614 and an upper die 618 to share the same lead frame 602, simplifies the design of the package 600, and reduces the footprint of the package 600. Noted that in an embodiment, this flip chip on lead frame technique eliminates the need to do wire bonding on the lower die 614. Also, since the source area 640 is coupled or connected to the lead frame 602, the heat generated by the source contact 640 can dissipate to the lead frame 602 and the printed circuit board (PCB) circuit paths.

In an embodiment, the upper die or chip 618 can be implemented with, but is not limited to, a die construction which has a source contact 632 and a gate contact 634 located on or as part of its top surface and a drain contact 630 located on or as part of its bottom surface. The upper die 618 can be flip chip attached or coupled to clips 616a and 616b such that the source contact 632 can be coupled or connected with the clip 616a while the gate contact 634 can be coupled or connected with the clip 616b. When coupled in this fashion, this simplifies the design of the package 600, and reduces the footprint of the package 600. Noted that in an embodiment, this flip chip technique eliminates the need to do wire bonding on the upper die 618. Also, since the source area 632 is coupled or connected to the clip 616a, which is coupled to the lead frame 602, the heat generated by the source contact 632 can dissipate to the lead frame 602 and the printed circuit board (PCB) circuit paths via the clip 616a. It is pointed out that in one embodiment, the lower die 614 and the upper die 618 can each be implemented with trench or split gate technology, but is not limited to such.

Within FIG. 6, in an embodiment, the stack die package 600 can include bigger clip 616a and a smaller clip 616b. On the top surface of the upper die 618, in one embodiment, the bigger clip 616a can be coupled or attached to the source contact area 632 and the smaller clip 616b can be coupled or attached to the gate contact area 634. In an embodiment, the clips 616a and 616b can actually be manufactured as part of one clip frame (not shown). Additionally, the clips 616a and 616b can also be attached to the surface of the lower die 614 and the lead frame 602 at the same time or approximately the same time. Note that in one embodiment, the clips 616a and 616b can have tie bars (not shown) to the clip frame thereby enabling them to be handled at the same time. It is pointed out that in an embodiment, the stack die package 600 can be implemented as, but is not limited to, a QFN (quad-flat no-leads) type of package. Accordingly, during the assembly process of multiple stack die packages (e.g., similar to 600), there is a package saw operation utilized to separate all the units from each other. The tie bars of the clips 616a and 616b are designed such that when doing the package saw operation, the tie bars are sawed or cut automatically. Since the saw operation is done after the molding process, the separated clips 616a and 616b will be held in place by a mold compound 642 of the stack die package 600.

Note that there are several advantages to the stack die package 600. For example, in one embodiment, any type of wire bonding has been eliminated from the stack die package 600. As such, the stack die package 600 is free of wire bonding. Additionally, in an embodiment, the flip chip of the lower die 614 allows a larger contact area between the drain area 638 and the clip 616a, which can provide the possibility of a larger die size of the upper die 618. In addition, in one embodiment, utilizing the clip 616b eliminates the need to do wire bonding on the gate contact 634 of the upper die 618. Therefore, there is no need to do silver plating on the lead frame 602. Furthermore, in an embodiment, the wire bonding is eliminated in the assembly process of the stack die package 600. As such, the assembly cost of the stack die package 600 is reduced.

Within FIG. 6, the stack die package 600 and its components can be implemented in a wide variety of ways. For example, in various embodiments, the clips 616a and 616b can be implemented in any manner similar to that described and shown within U.S. patent application Ser. No. 13/229,667, now U.S. Pat. No. 8,822,273, entitled "Dual Lead Frame Semiconductor Package and Method of Manufacture," by Frank Kuo et al., filed Sep. 9, 2011, which is hereby incorporated by reference. In one embodiment, the stack die package 600 can be implemented as a power MOSFET package, but is not limited to such. It is pointed out that the clips 616a, 616b, and 620 can each be implemented in a wide variety of ways. For example, in various embodiments, the clips 616a, 616b, and 620 can each be implemented with one or more electrically conductive materials (e.g., one or more metals, such as copper).

In one embodiment, the lead frame 602 can include, but is not limited to, a $D_L/S_H$ lead 604 for coupling to both the drain ($D_L$) 638 of the lower die 614 and the source ($S_H$) 632 of the upper die 618. Additionally, the lead frame 602 can include, but is not limited to, a $G_L$ lead 606 for coupling to the gate 636 of the lower die 614, a $S_L$ lead 608 for coupling to the source 640 of the lower die 614, a $G_H$ lead 610 for coupling to the gate 634 of the upper die 618, and a $D_H$ lead 612 for coupling to the drain 630 of the upper die 618. The gate contact 636 of the lower die 614 can be coupled to the lead 606 via solder paste 628 while the source contact 640 can be coupled to the lead 608 via solder paste 628. In addition, the clip 616a can be coupled to the lead 604. Furthermore, the clip 616a can be coupled to both the drain contact 638 of the lower die 614 via solder paste 626 and to the source contact 632 of the upper die 616 via solder paste 624. In this fashion, the source contact 632, the drain contact 638, and the lead 604 can be coupled together. Therefore, in an embodiment, the clip 616a can provide a high current path between the source contact 632 and the drain contact 638. In addition, the clip 616a can provide a high current path to the lead 604 for the source contact 632 and the drain contact 638.

Within FIG. 6, the clip 620 can be coupled to the lead 612. Additionally, the clip 620 can be coupled to the drain contact 630 of the upper die 618 via solder paste 622. Furthermore, the clip 616b can be coupled to the lead 610. In addition, the clip 616b can be coupled to the gate contact 634 of the upper die 618 via solder paste 624. It is pointed out that within the present embodiment, the lower die 614 is located above the lead frame 602 while the upper die 618 is located above the lower die 614. In this fashion, the upper die 618 is stacked above the lower die 614, which is coupled to the lead frame 602. In an embodiment, the stack die package 600 can include molding 642 that covers and/or encapsulates the clips 616a, 616b, and 620, the upper die 618, the lower die 614, the solder pastes 622, 624, 626, and 628, and portions of the lead frame 602. In various embodiments, it is noted that one or more of the solder pastes 622, 624, 626, and 628 can instead be implemented with a conductive epoxy or conductive adhesive, but is not limited to such.

Note that the stack die package 600 may not include all of the elements illustrated by FIG. 6. Additionally, the stack die package 600 can be implemented to include one or more elements not illustrated by FIG. 6. It is noted that the stack die package 600 can be utilized or implemented in any manner similar to that described herein, but is not limited to such.

Figure 7:
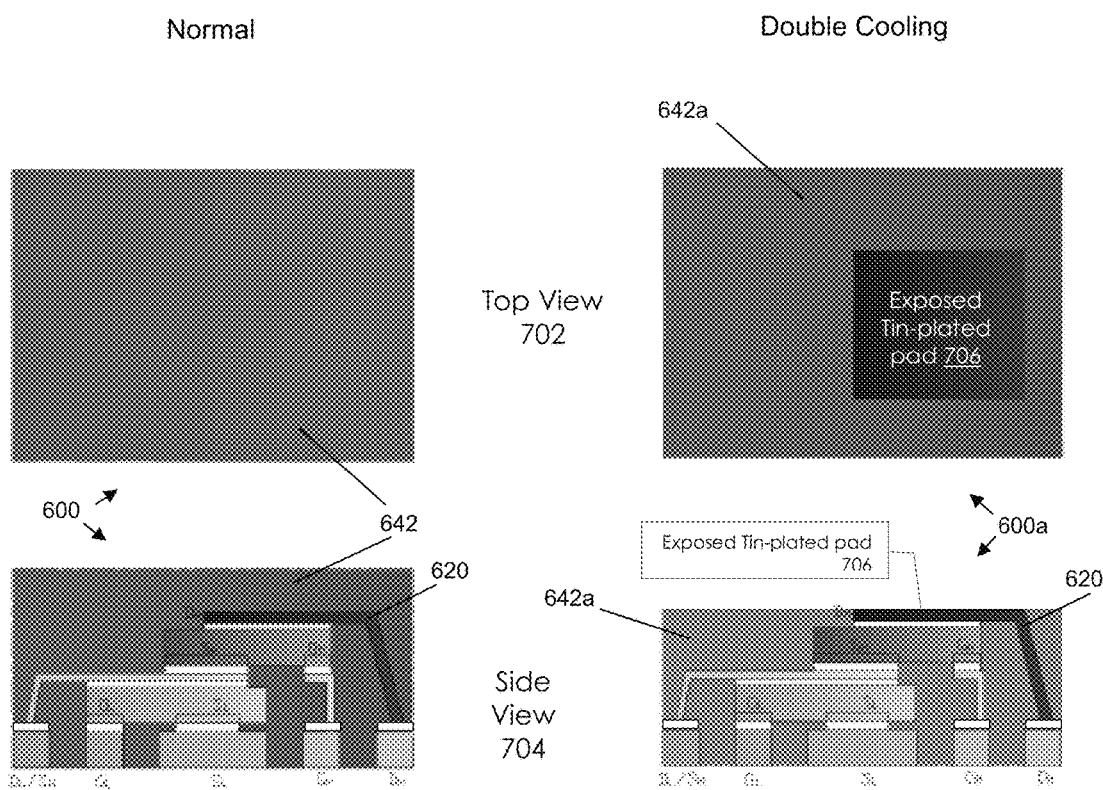
FIG. 7 includes top views and side sectional views of stack die packages in accordance with various embodiments of the invention.

FIG. 7 illustrates top views 702 and side sectional views 704 of stack die packages 600 and 600a in accordance with various embodiments of the invention. Specifically, the right half of FIG. 7 illustrates a "double cooling" structure of the stack die package 600a in comparison with the left half of FIG. 7 that illustrates a "normal" structure of the stack die package 600. It is noted that the main difference between the "double cooling" structure of the stack die package 600a and the "normal" structure of the stack die package 600 is that the top clip 620 can be utilized for top side cooling of the stack die package 600a. In an embodiment, at least a portion of a top surface of the upper clip 620 of the stack die package 600a is not covered with the molding 642a thereby enabling heat to escape via the clip 620. As such, in an embodiment, the "double cooling" is achieved by heat escaping the stack die package 600a via the lead frame 602 (as previously described herein) and heat escaping the stack die package 600a via at least a portion of the top surface of the clip 620.

Figure 31:
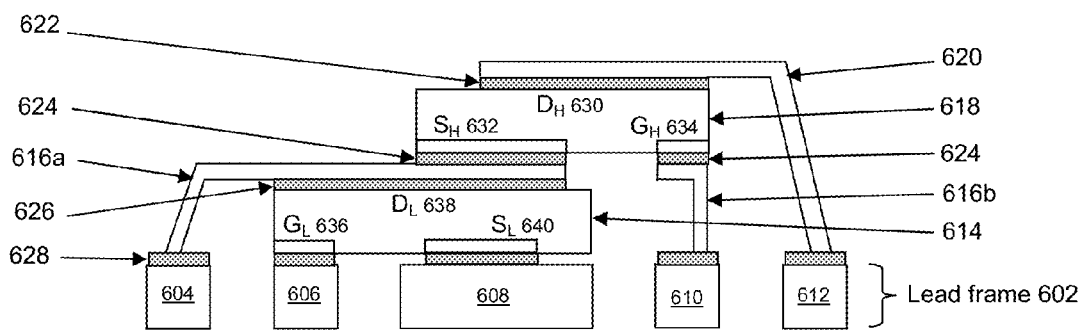
Figure 34:
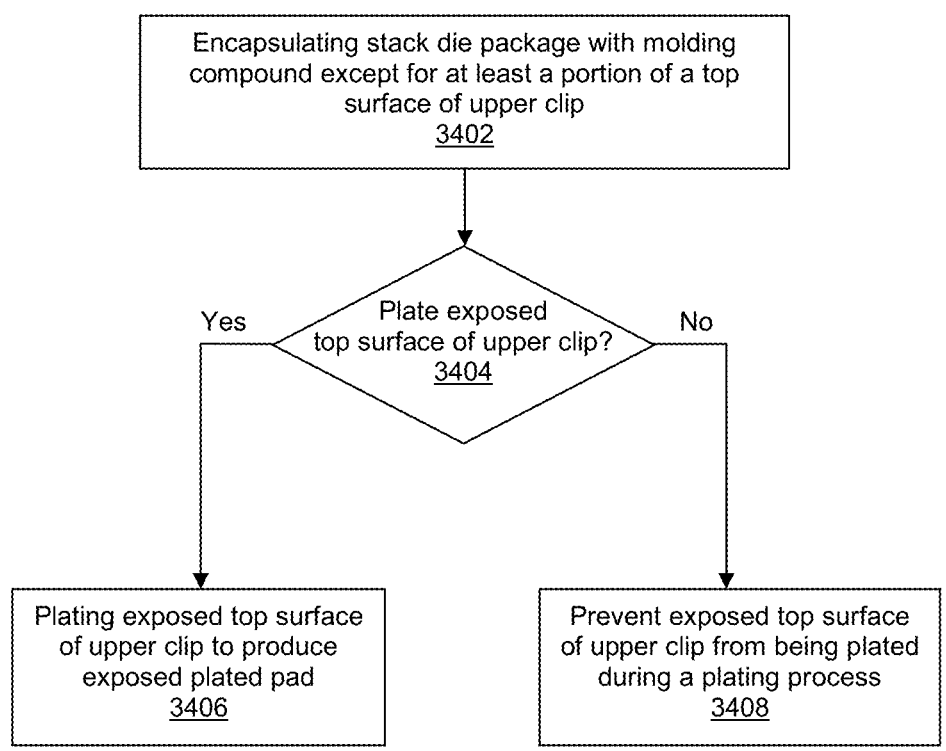
FIG. 34 is a flow diagram of yet another method in accordance with various embodiments of the invention.

In one embodiment, a molding process can be utilized that covers or encapsulates the stack die assembly (e.g., as shown in FIG. 31) with a molding compound or material 642a except for at least a portion of a top or upper surface of the upper clip 620. In an embodiment, the "double cooling" structure of the stack die package 600a can be fabricated with a specific molding process that can involve a specific mold tool design. It is pointed out that FIG. 34 is a flow diagram of a method 3400 for fabricating one or more "double cooling" stack die packages in accordance with various embodiments of the invention. After the molding process results in at least a portion of the top surface of the clip 620 being exposed, it may then be plated (e.g., with one or more metals, such as, tin) resulting in the formation of an exposed tin-plated pad 706 on the top surface of the clip 620, in an embodiment. Therefore, after the completion of this process, the top view 702 and side sectional view 704 of the stack die package 600a are shown on the right half of FIG. 7. It is noted that in various embodiments, the top surface of the clip 620 may or may not be plated with any metals (e.g., which is described herein with reference to FIG. 34). It is pointed out that in an embodiment, a similar "double cooling" process can be performed on the stack die package 400 in order to expose and plate the top or upper surface of the clip 420a thereby resulting in the formation of an exposed plated pad (e.g., similar to the exposed tin-plated pad 706 of the stack die package 600a).

It is noted that the stack die package 600a may not include all of the elements illustrated by FIG. 7. In addition, the stack die package 600a can be implemented to include one or more elements not illustrated by FIG. 7. It is pointed out that the stack die package 600a can be utilized or implemented in any manner similar to that described herein, but is not limited to such.

Figure 8:
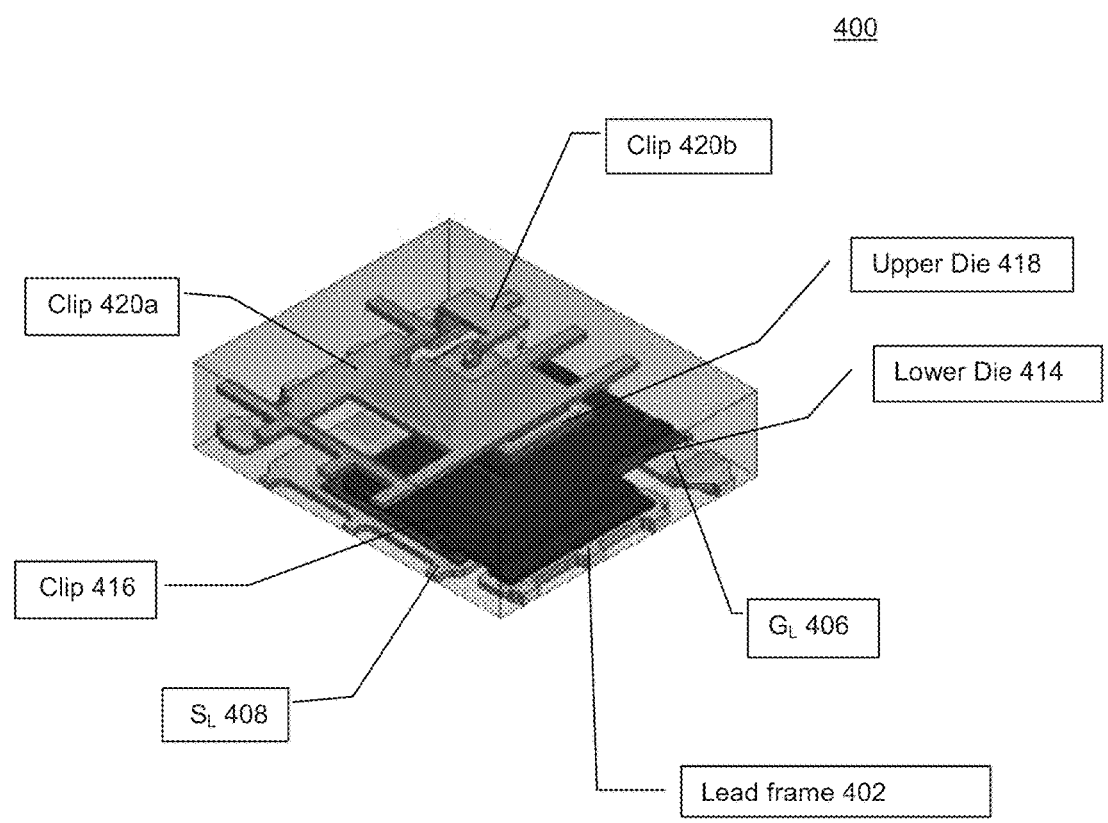
FIG. 8 is an isometric view of a stack die package in accordance with various embodiments of the invention.

FIG. 8 is an isometric view of the stack die package 400 in accordance with various embodiments of the invention. The present embodiment of the stack die package 400 illustrates exemplary shapes and orientations of selected different internal components of the stack die package 400. For example, FIG. 8 illustrates exemplary shapes and orientations for the clips 416, 420a, and 420b, the upper die 418, the lower die 414, the lead frame 402, and the $S_L$ lead 408 and the $G_L$ lead 406 of the lead frame 402.

It is noted that the stack die package 400 may not include all of the elements illustrated by FIG. 8. In addition, the stack die package 400 can be implemented to include one or more elements not illustrated by FIG. 8. It is pointed out that the stack die package 400 can be utilized or implemented in any manner similar to that described herein, but is not limited to such.

Figure 9:
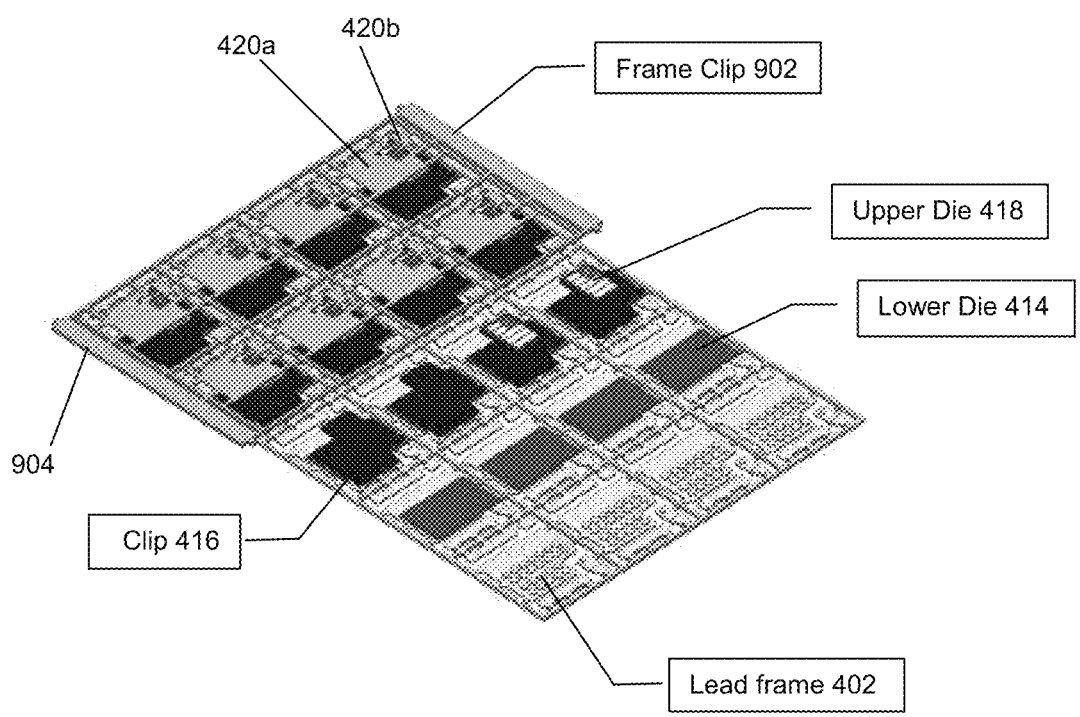
FIG. 9 is an assembly process view of multiple stack dies in accordance with various embodiments of the invention.

FIG. 9 is an assembly process view of multiple stack dies (e.g., 400) in accordance with various embodiments of the invention. For example, the present embodiment of FIG. 9 illustrates the lead frame 402 (e.g., which is a one piece frame) having multiple lower dies 414 situated above the lead frame 402. In addition, multiple clips 416 are shown that can be individually placed above each of the multiple lower dies 414. The present embodiment of FIG. 9 also illustrates a frame clip 902 (e.g., which is a one piece frame) that includes, but is not limited to, eight sets of the clips 420a and 420b that are all coupled or connected together. In an embodiment, it is noted that the frame clip 902 can include tie bars that couple or connect together all the sets of clips 420a and 420b. In addition, in an embodiment, the frame clip 902 can include two larger ends 904 which can be utilized to pick up the frame clip 902 and position it and all the sets of clips 420a and 420b at the same time or approximately the same time above multiple upper dies 418 and multiple lower dies 414. It is noted that the frame clip 902 can be implemented to include any number of sets of the clips 420a and 420b (or the clips 616a and 616b), but is not limited to such. In an embodiment, the frame clip 902 can be fabricated of, but is not limited to, one or more electrically conductive materials (e.g., one or more metals, such as copper).

It is noted that the frame clip 902 may not include all of the elements illustrated by FIG. 9. In addition, the frame clip 902 can be implemented to include one or more elements not illustrated by FIG. 9. It is pointed out that the frame clip 902 can be utilized or implemented in any manner similar to that described herein, but is not limited to such.

Figure 10:
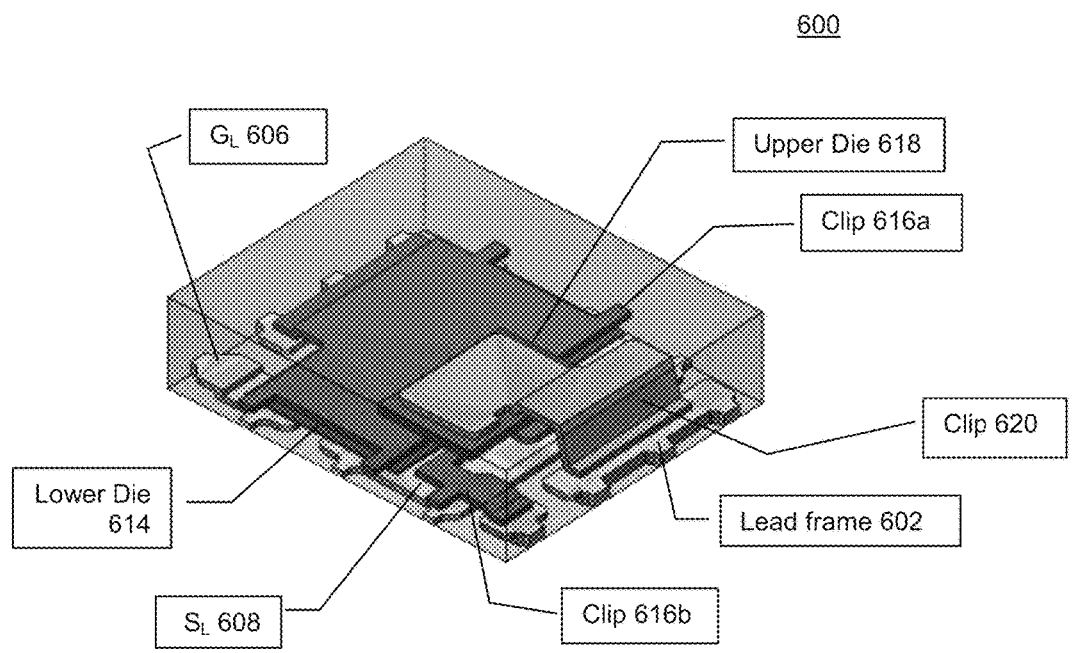
FIG. 10 is an isometric view of a stack die package in accordance with various embodiments of the invention.

FIG. 10 is an isometric view of the stack die package 600 in accordance with various embodiments of the invention. The present embodiment of the stack die package 600 illustrates exemplary shapes and orientations of selected different internal components of the stack die package 600. For example, FIG. 10 illustrates exemplary shapes and orientations for the clips 620, 616a, and 616b, the upper die 618, the lower die 614, the lead frame 602, and the $S_L$ lead 608 and the $G_L$ lead 606 of the lead frame 602.

It is noted that the stack die package 600 may not include all of the elements illustrated by FIG. 10. In addition, the stack die package 600 can be implemented to include one or more elements not illustrated by FIG. 10. It is pointed out that the stack die package 600 can be utilized or implemented in any manner similar to that described herein, but is not limited to such.

Figure 11:
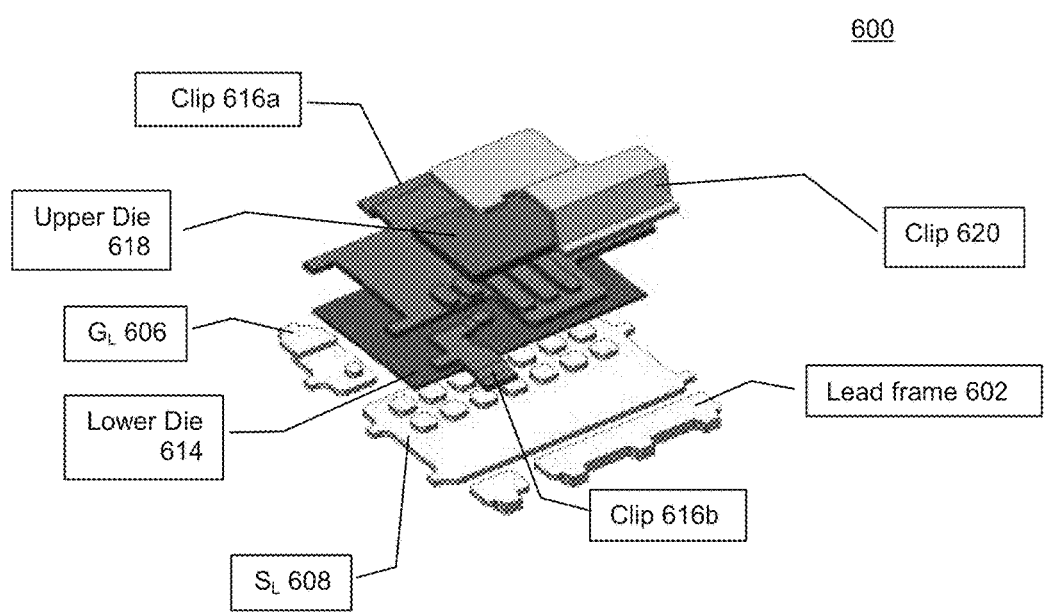
FIG. 11 is an exploded view of a stack die package in accordance with various embodiments of the invention.

FIG. 11 is an exploded view of the stack die package 600 in accordance with various embodiments of the invention. The present embodiment of the stack die package 600 illustrates exemplary shapes and orientations of selected different internal components of the stack die package 600. For example, FIG. 11 illustrates exemplary shapes and orientations for the clips 620, 616a, and 616b, the upper die 618, the lower die 614, the lead frame 602, and the $S_L$ lead 608 and the $G_L$ lead 606 of the lead frame 602.

It is noted that the stack die package 600 may not include all of the elements illustrated by FIG. 11. In addition, the stack die package 600 can be implemented to include one or more elements not illustrated by FIG. 11. It is pointed out that the stack die package 600 can be utilized or implemented in any manner similar to that described herein, but is not limited to such.

Figure 12:
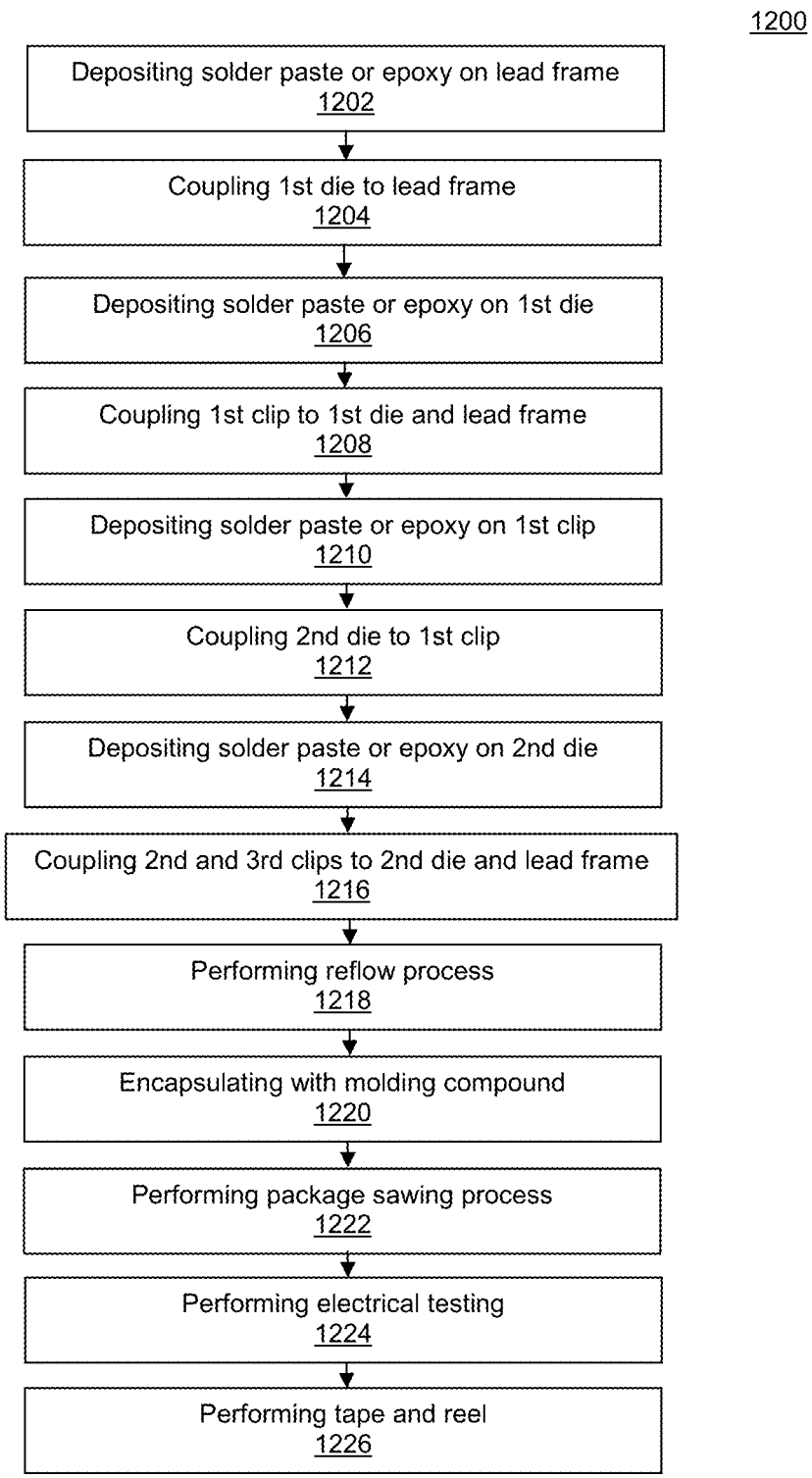
FIG. 12 is a flow diagram of a method in accordance with various embodiments of the invention.

FIG. 12 is a flow diagram of a method 1200 for fabricating one or more stack die packages in accordance with various embodiments of the invention. Although specific operations are disclosed in FIG. 12, such operations are examples. The method 1200 may not include all of the operations illustrated by FIG. 12. Also, method 1200 may include various other operations and/or variations of the operations shown. Likewise, the sequence of the operations of flow diagram 1200 can be modified. It is appreciated that not all of the operations in flow diagram 1200 may be performed. In various embodiments, one or more of the operations of method 1200 can be controlled or managed by software, by firmware, by hardware or by any combination thereof, but is not limited to such. Method 1200 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 13:
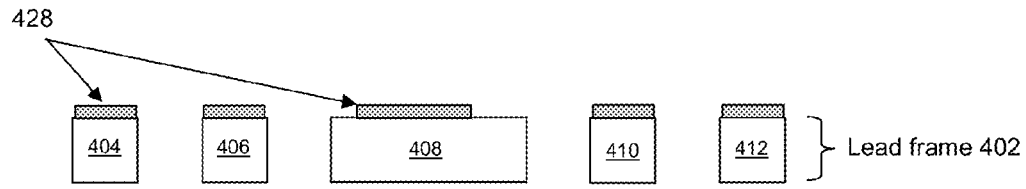
FIGS. 13, 14, 15, 16, 17, 18, 19, 20, 21, and 22 are side sectional views of selected fabrication stages of a stack die package in accordance with various embodiments of the invention.

At operation 1202 of FIG. 12, solder paste (e.g., 428) or epoxy can be deposited onto a lead frame (e.g., 402). It is noted that operation 1202 can be implemented in a wide variety of ways. For example, in one embodiment, FIG. 13 illustrates a side sectional view of solder paste 428 (or epoxy) dispensed or printed onto the leads 404, 406, 408, 410, and 412 of the lead frame 402 at operation 1202, but is not limited to such. Operation 1202 can be implemented in any manner similar to that described herein, but is not limited to such.

Figure 14:
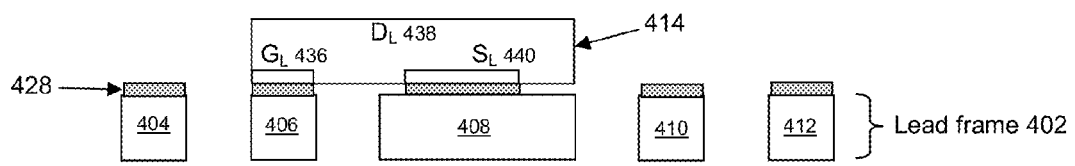

At operation 1204, a first die or chip (e.g., 414) can be coupled or attached to the lead frame. Note that operation 1204 can be implemented in a wide variety of ways. For example, in an embodiment, FIG. 14 illustrates the gate contact 436 and source contact 440 of the lower die 414 coupled or attached to the leads 406 and 408, respectively, of the lead frame 402 at operation 1204 utilizing a flip chip on lead frame technique, but is not limited to such. In one embodiment, at operation 1204, the lower die 414 can be picked up from the wafer, flipped over, and placed onto the solder paste 428 (or epoxy) previously deposited onto the lead frame 402 at operation 1202. Operation 1204 can be implemented in any manner similar to that described herein, but is not limited to such.

Figure 15:
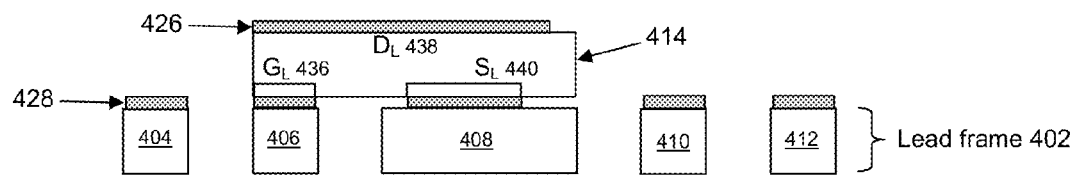

At operation 1206 of FIG. 12, solder paste (e.g., 426) or epoxy can be deposited onto the back side of the first die or chip. It is pointed out that operation 1206 can be implemented in a wide variety of ways. For example, in an embodiment, FIG. 15 illustrates the solder paste 426 (or epoxy) dispensed or printed onto the drain contact 438 (e.g., back side) of the lower die 414 at operation 1206, but is not limited to such. Operation 1206 can be implemented in any manner similar to that described herein, but is not limited to such.

Figure 16:
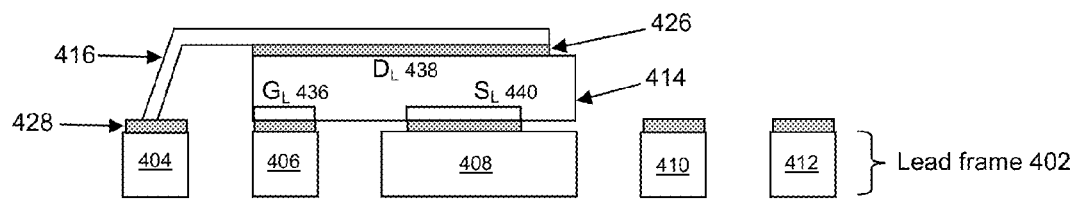

At operation 1208, a first clip (e.g., 416) can be coupled or attached to the first die and the lead frame. Note that operation 1208 can be implemented in a wide variety of ways. For example, in an embodiment, FIG. 16 illustrates the clip 416 coupled or attached to the lower die 414 via the solder paste 426 (or epoxy) and the lead 404 of the lead frame 402 via the solder paste 428 (or epoxy) at operation 1208. Operation 1208 can be implemented in any manner similar to that described herein, but is not limited to such.

Figure 17:
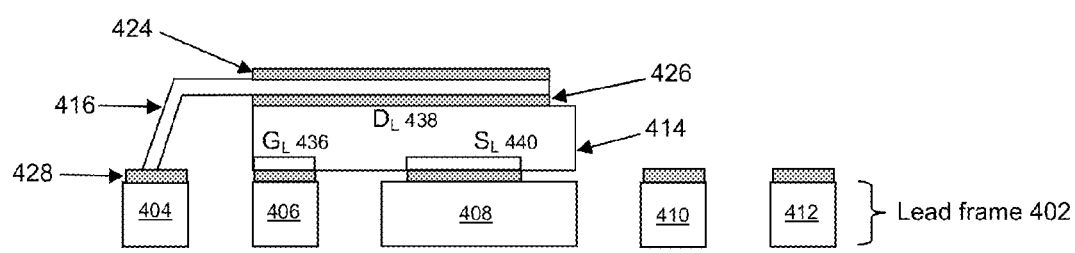

At operation 1210 of FIG. 12, solder paste (e.g., 424) or epoxy can be deposited on the first clip. It is noted that operation 1210 can be implemented in a wide variety of ways. For example, in an embodiment, FIG. 17 illustrates the solder paste 424 (or epoxy) dispensed or printed onto the clip 416 at operation 1210, but is not limited to such. Operation 1210 can be implemented in any manner similar to that described herein, but is not limited to such.

Figure 18:
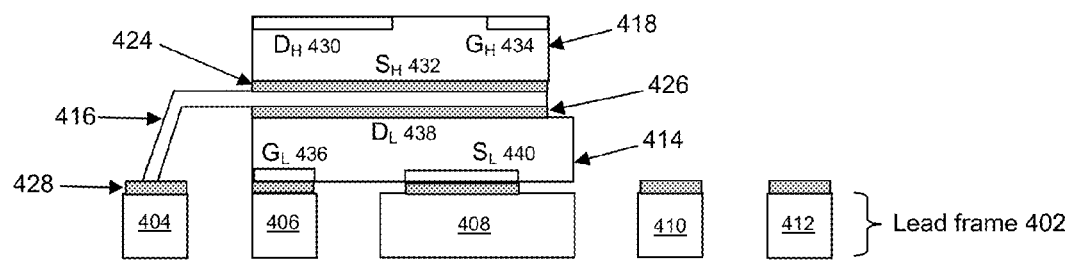

At operation 1212, a second die or chip (e.g., 418) can be coupled or attached to the first clip. It is pointed out that operation 1212 can be implemented in a wide variety of ways. For example, in an embodiment, FIG. 18 illustrates the upper die 418 coupled or attached to the clip 416 via the solder paste 424 (or epoxy) at operation 1212, but is not limited to such. Operation 1212 can be implemented in any manner similar to that described herein, but is not limited to such.

Figure 19:
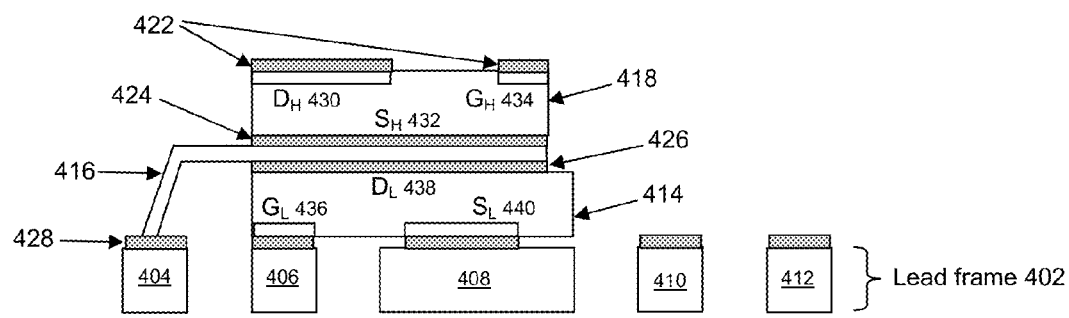

At operation 1214 of FIG. 12, solder paste (e.g., 422) or epoxy can be deposited onto the second die. Note that operation 1214 can be implemented in a wide variety of ways. For example, in an embodiment, FIG. 19 illustrates the solder paste 422 (or epoxy) dispensed or printed onto the drain contact 430 and the gate contact 434 of the upper die 418 at operation 1214, but is not limited to such. Operation 1214 can be implemented in any manner similar to that described herein, but is not limited to such.

Figure 20:
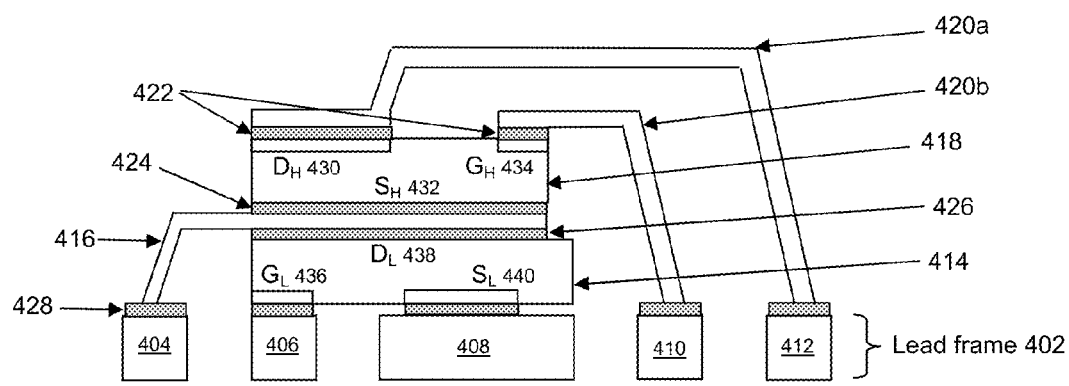

At operation 1216, a second clip (e.g., 420a) and a third clip (e.g., 420b) can be coupled or attached to the second die and the lead frame. It is noted that operation 1216 can be implemented in a wide variety of ways. For example, in one embodiment, FIG. 20 illustrates the second clip 420a coupled or attached to the drain contact 430 of the upper die 418 via solder paste 422 (or epoxy) and the lead 412 of the lead frame 402 via solder paste 428 (or epoxy) at operation 1216. In addition, FIG. 20 illustrates the third clip 420b coupled or attached to the gate contact 434 of the upper die 418 via the solder paste 422 (or epoxy) and the lead 410 of the lead frame 402 via solder paste 428 (or epoxy) at operation 1216. In an embodiment, it is pointed out that at operation 1216, the second and third clips can be coupled or attached to the second die and the lead frame at the same time or approximately the same time (e.g., utilizing a clip frame similar to the clip frame 902). Operation 1216 can be implemented in any manner similar to that described herein, but is not limited to such.

At operation 1218 of FIG. 12, a reflow process can be performed on the existing stack die assembly (e.g., as shown in FIG. 20). It is pointed out that operation 1218 can be implemented in a wide variety of ways. For example, in an embodiment, the reflow process at operation 1218 can be implemented by increasing the temperature (e.g., greater than 350° C. or greater than 370° C.) of the stack die assembly, but is not limited to such. Note that under these conditions, in one embodiment, flux can be removed from the solder paste and when the temperature decreases, the solder can bond with the joints. In an embodiment, the operation 1218 can be implemented to include a cleaning process that occurs after the reflow process. Operation 1218 can be implemented in any manner similar to that described herein, but is not limited to such.

Figure 21:
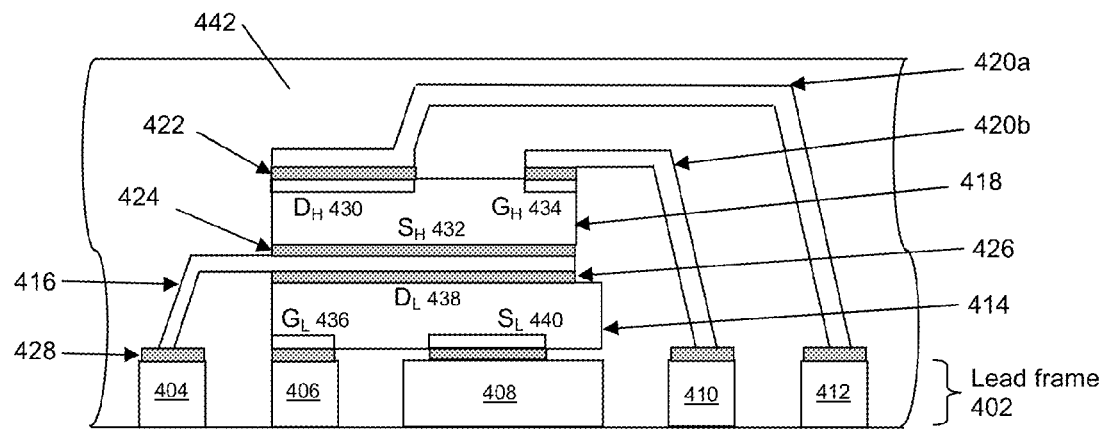

At operation 1220, the stack die assembly can be covered or encapsulated by a molding compound or material. Note that operation 1220 can be implemented in a wide variety of ways. For example, in an embodiment, FIG. 21 illustrates a molding compound or material 442 covering or encapsulating the stack die assembly at operation 1220, but is not limited to such. Operation 1220 can be implemented in any manner similar to that described herein, but is not limited to such.

Figure 22:
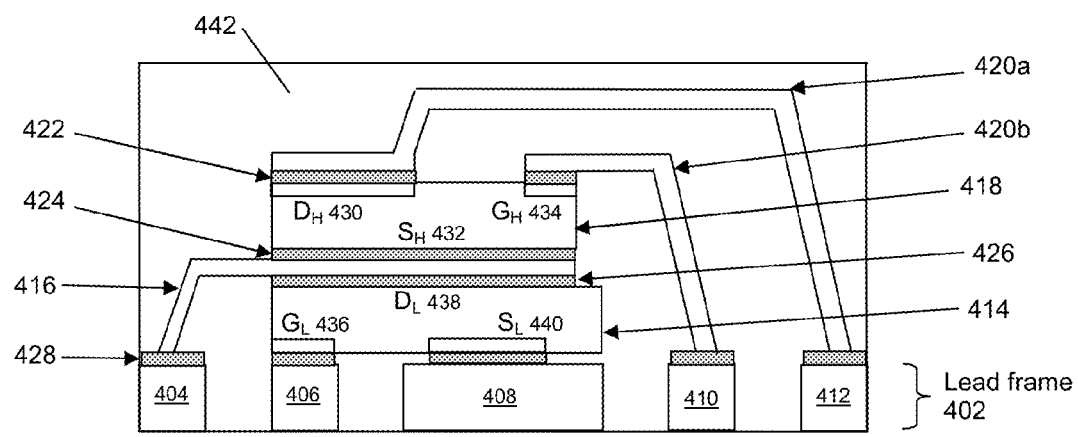

At operation 1222 of FIG. 12, a package sawing process or operation can be performed on the stack die assembly covered with the molding compound or material. It is noted that operation 1222 can be implemented in a wide variety of ways. For example, in an embodiment, FIG. 22 illustrates the occurrence of a package sawing process at operation 1222 resulting in the stack die package having, but not limited to, substantially vertical surfaces located near the leads 404 and 412 of the lead frame 404. In one embodiment, the package sawing process can automatically cut tie bars (e.g., 904) that were coupling the second clip (e.g., 420a) and the third clip (e.g., 420b). Consequently, the second clip and the third clip are separated, become functional, and are held in place by the molding (e.g., 442). Operation 1222 can be implemented in any manner similar to that described herein, but is not limited to such.

At operation 1224, electrical testing can be performed on the stack die package to determine whether it operates properly. It is pointed out that operation 1224 can be implemented in a wide variety of ways. For example, operation 1224 can be implemented in any manner similar to that described herein, but is not limited to such.

At operation 1226 of FIG. 12, tape and reel can be performed on the stack die package. Note that operation 1226 can be implemented in a wide variety of ways. For example, in an embodiment, the tape and reel at operation 1226 can include putting the stack die package into packing material to protect it during transportation to a desired location. Operation 1226 can be implemented in any manner similar to that described herein, but is not limited to such.

In various embodiments, it is noted that one or more of the solder pastes described herein can instead be implemented with a conductive epoxy or conductive adhesive, but are not limited to such. In addition, in an embodiment, operation 1218 may not be performed if solder paste is not utilized during method 1200.

It is pointed out that even though method 1200 was described with reference to fabricating a single stack die package, method 1200 can be modified in accordance with various embodiments of the invention to fabricate multiple stack die packages at substantially the same time.

Figure 23:
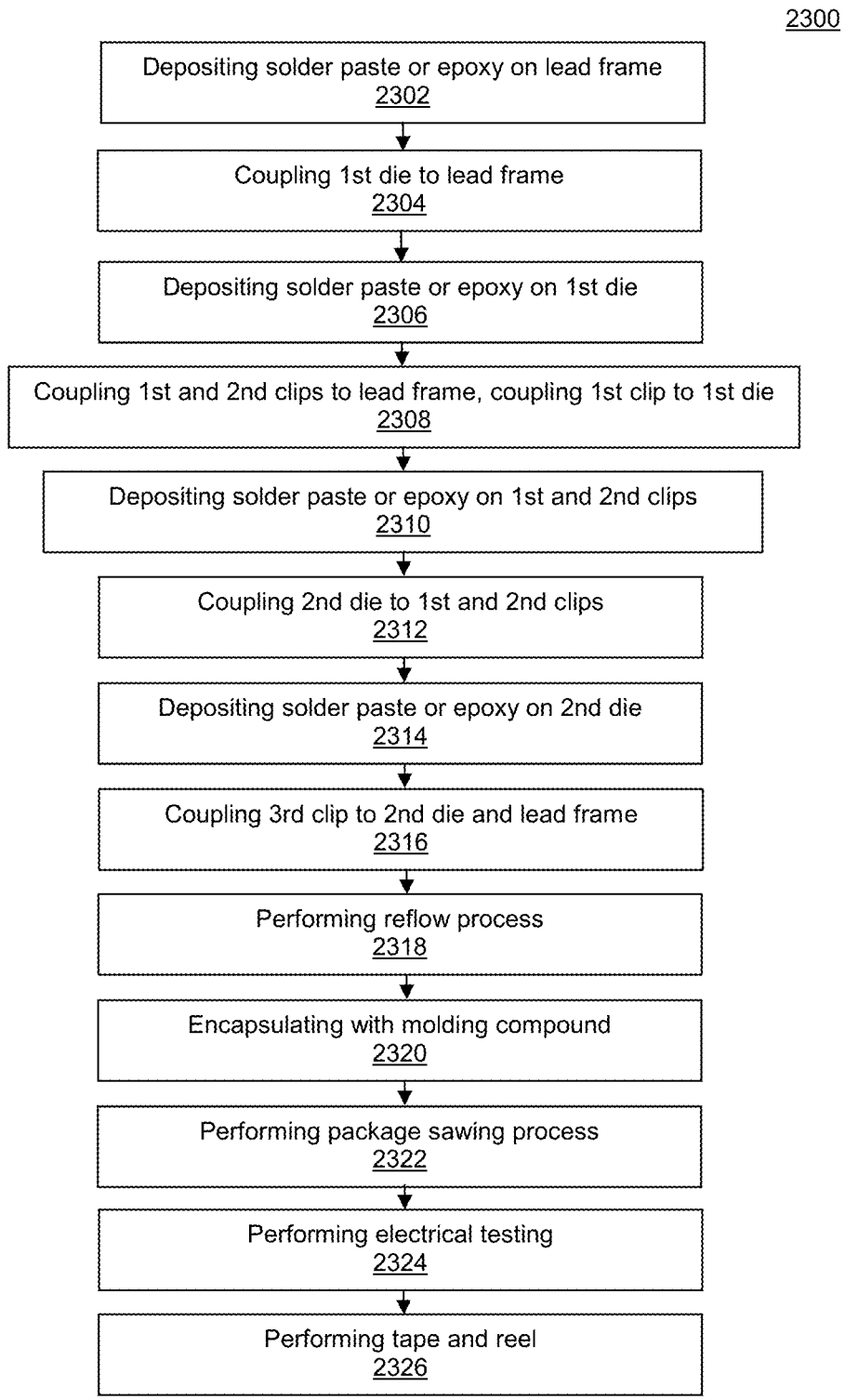
FIG. 23 is a flow diagram of another method in accordance with various embodiments of the invention.

FIG. 23 is a flow diagram of a method 2300 for fabricating one or more stack die packages in accordance with various embodiments of the invention. Although specific operations are disclosed in FIG. 23, such operations are examples. The method 2300 may not include all of the operations illustrated by FIG. 23. Also, method 2300 may include various other operations and/or variations of the operations shown. Likewise, the sequence of the operations of flow diagram 2300 can be modified. It is appreciated that not all of the operations in flow diagram 2300 may be performed. In various embodiments, one or more of the operations of method 2300 can be controlled or managed by software, by firmware, by hardware or by any combination thereof, but is not limited to such. Method 2300 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 24:
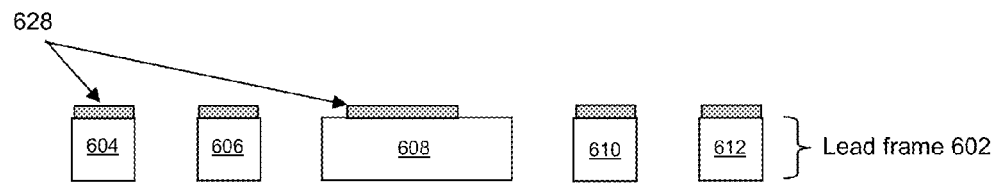
FIGS. 24, 25, 26, 27, 28, 29, 30, 31, 32, and 33 are side sectional views of selected fabrication stages of a stack die package in accordance with various embodiments of the invention.

At operation 2302 of FIG. 23, solder paste (e.g., 628) or epoxy can be deposited onto a lead frame (e.g., 602). It is noted that operation 2302 can be implemented in a wide variety of ways. For example, in an embodiment, FIG. 24 illustrates a side sectional view of solder paste 628 (or epoxy) dispensed or printed onto the leads 604, 606, 608, 610, and 612 of the lead frame 602 at operation 2302, but is not limited to such. Operation 2302 can be implemented in any manner similar to that described herein, but is not limited to such.

Figure 25:
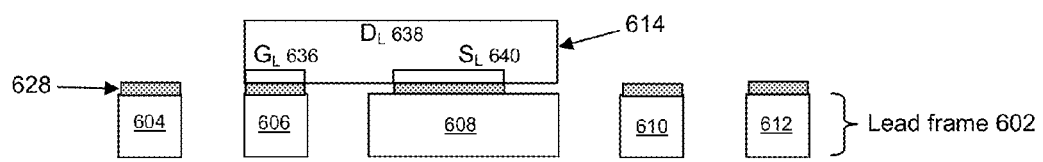

At operation 2304, a first die or chip (e.g., 614) can be coupled or attached to the lead frame. Note that operation 2304 can be implemented in a wide variety of ways. For example, in an embodiment, FIG. 25 illustrates the gate contact 636 and source contact 640 of the lower die 614 coupled or attached to the leads 606 and 608, respectively, of the lead frame 602 at operation 2304 utilizing a flip chip on lead frame technique, but is not limited to such. In one embodiment, at operation 2304, the lower die 614 can be picked up from the wafer, flipped over, and placed onto the solder paste 628 (or epoxy) previously deposited onto the lead frame 602. Operation 2304 can be implemented in any manner similar to that described herein, but is not limited to such.

Figure 26:
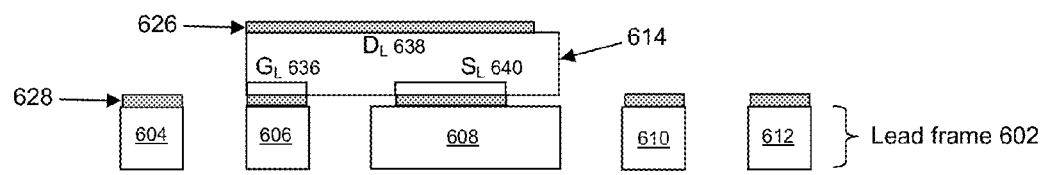

At operation 2306 of FIG. 23, solder paste (e.g., 626) or epoxy can be deposited onto the back side of the first die or chip. It is pointed out that operation 2306 can be implemented in a wide variety of ways. For example, in an embodiment, FIG. 26 illustrates the solder paste 626 (or epoxy) dispensed or printed onto the drain contact 638 (e.g., back side) of the lower die 614 at operation 2306, but is not limited to such. Operation 2306 can be implemented in any manner similar to that described herein, but is not limited to such.

Figure 27:
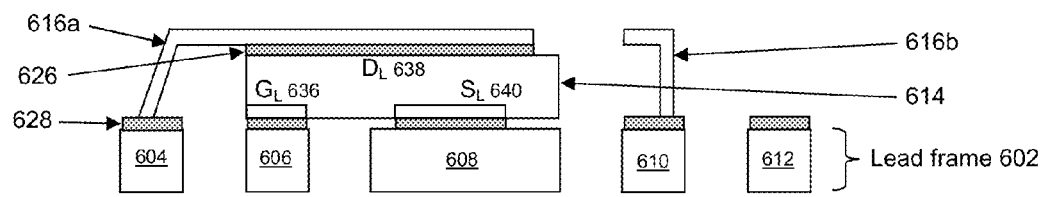

At operation 2308, a first clip (e.g., 616a) and a second clip (e.g., 616b) can be coupled or attached to the lead frame while the first clip is also coupled or attached to the first die. It is noted that operation 2308 can be implemented in a wide variety of ways. For example, in an embodiment, FIG. 27 illustrates the first clip 616a and the second clip 616b coupled or attached to the leads 604 and 610, respectively, of the lead frame 602 via solder paste 628 (or epoxy) while the first clip 616a is also coupled or attached to the drain contact 638 of the first die 614 via solder 626 (or epoxy) at operation 2308. In an embodiment, it is pointed out that at operation 2308, the first and second clips can be coupled or attached to the lead frame while the first clip can also be coupled or attached to the first die at the same time or approximately the same time (e.g., utilizing a clip frame similar to the clip frame 902). Operation 2308 can be implemented in any manner similar to that described herein, but is not limited to such.

Figure 28:
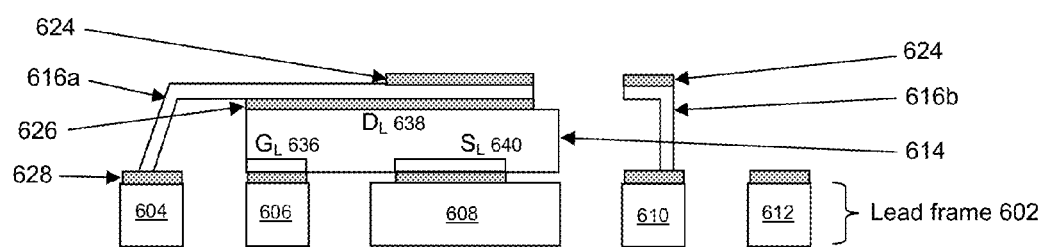

At operation 2310 of FIG. 23, solder paste (e.g., 624) or epoxy can be deposited on the first and second clips. It is noted that operation 2310 can be implemented in a wide variety of ways. For example, in an embodiment, FIG. 28 illustrates the solder paste 624 (or epoxy) dispensed or printed onto the clips 616a and 616b at operation 2310, but is not limited to such. Operation 2310 can be implemented in any manner similar to that described herein, but is not limited to such.

Figure 29:
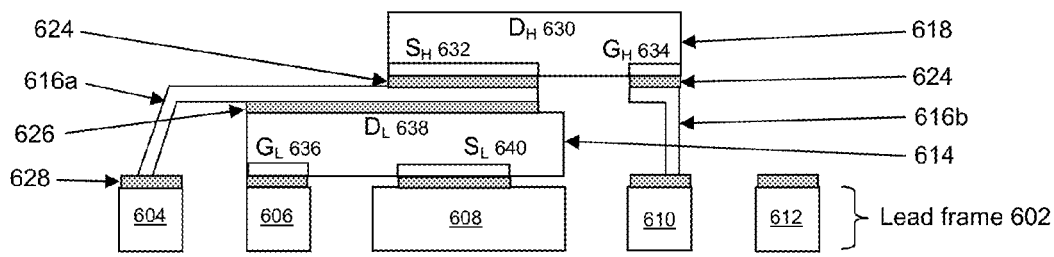

At operation 2312, a second die or chip (e.g., 618) can be coupled or attached to the first and second clips. It is pointed out that operation 2312 can be implemented in a wide variety of ways. For example, in an embodiment, FIG. 29 illustrates the source contact 632 of the upper die 618 coupled or attached to the clip 616a via the solder paste 624 (or epoxy) and the gate contact 634 of the upper die 618 coupled or attached to the clip 616b via the solder paste 624 (or epoxy) at operation 2312, but is not limited to such. Operation 2312 can be implemented in any manner similar to that described herein, but is not limited to such.

Figure 30:
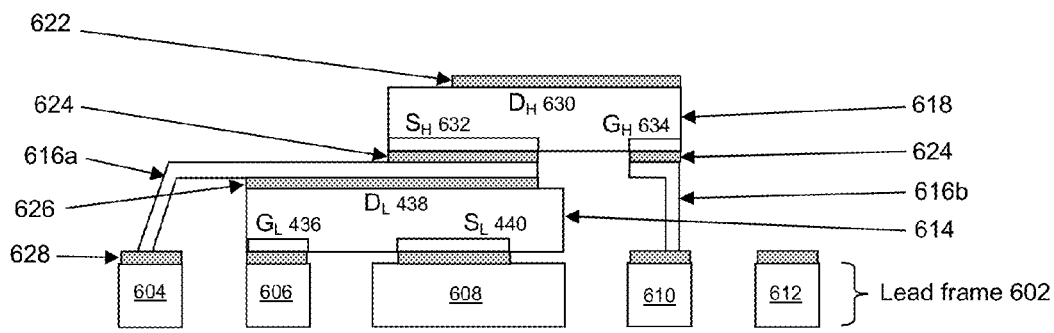

At operation 2314 of FIG. 23, solder paste (e.g., 622) or epoxy can be deposited onto the second die. Note that operation 2314 can be implemented in a wide variety of ways. For example, in an embodiment, FIG. 30 illustrates the solder paste 622 (or epoxy) dispensed or printed onto the drain contact 630 of the upper die 618 at operation 2314, but is not limited to such. Operation 2314 can be implemented in any manner similar to that described herein, but is not limited to such.

At operation 2316, a third clip (e.g., 620) can be coupled or attached to the second die and the lead frame. Note that operation 2316 can be implemented in a wide variety of ways. For example, in an embodiment, FIG. 31 illustrates the clip 620 coupled or attached to the drain contact 630 of the upper die 614 via the solder paste 622 (or epoxy) and the lead 612 of the lead frame 602 via the solder paste 628 (or epoxy) at operation 2316. Operation 2316 can be implemented in any manner similar to that described herein, but is not limited to such.

At operation 2318 of FIG. 23, a reflow process can be performed on the existing stack die assembly (e.g., as shown in FIG. 31). It is pointed out that operation 2318 can be implemented in a wide variety of ways. For example, in an embodiment, the reflow process at operation 2318 can be implemented by increasing the temperature (e.g., greater than 350° C. or greater than 370° C.) of the stack die assembly, but is not limited to such. It is noted that under these conditions, in one embodiment, flux can be removed from the solder paste and when the temperature decreases, the solder can bond with the joints. In an embodiment, the operation 2318 can be implemented to include a cleaning process that occurs after the reflow process. Operation 2318 can be implemented in any manner similar to that described herein, but is not limited to such.

Figure 32:
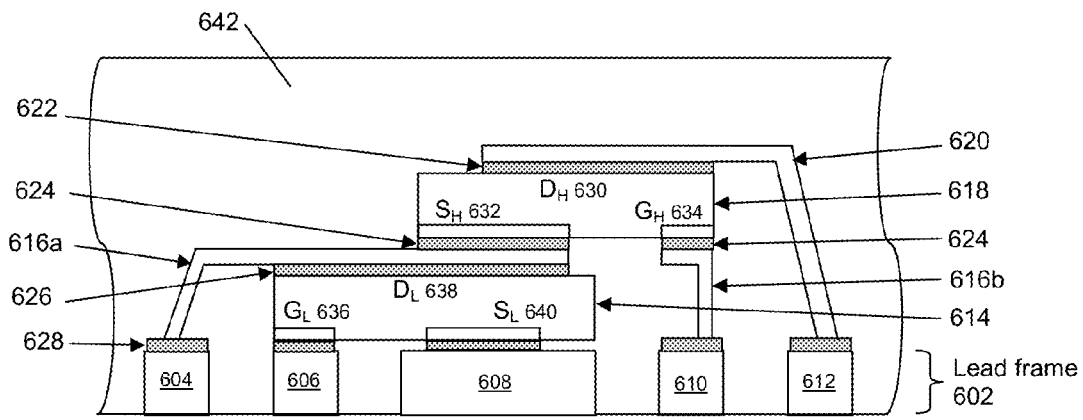

At operation 2320, the stack die assembly can be covered or encapsulated by a molding compound or material. It is pointed out that operation 2320 can be implemented in a wide variety of ways. For example, in an embodiment, FIG. 32 illustrates a molding compound or material 642 covering or encapsulating the stack die assembly at operation 2320, but is not limited to such. Operation 2320 can be implemented in any manner similar to that described herein, but is not limited to such.

Figure 33:
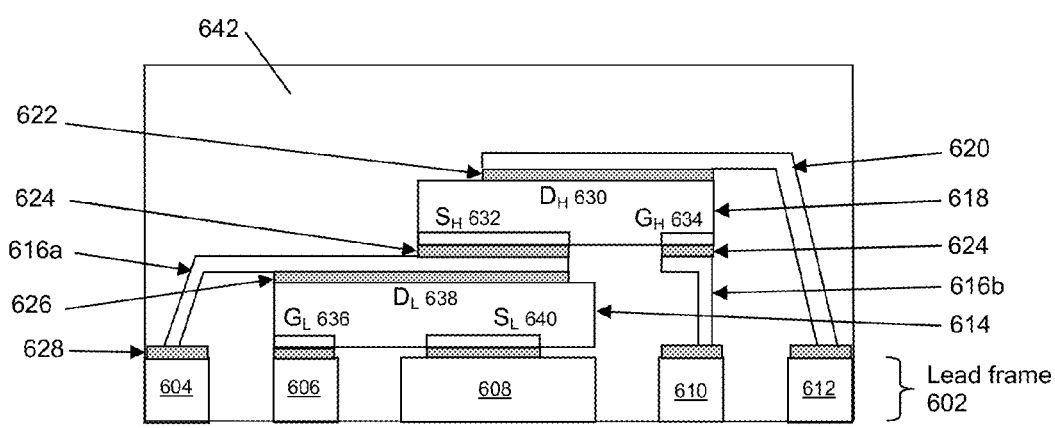

At operation 2322 of FIG. 23, a package sawing process or operation can be performed on the stack die assembly covered with the molding compound or material. It is noted that operation 2322 can be implemented in a wide variety of ways. For example, in an embodiment, FIG. 33 illustrates the occurrence of a package sawing process at operation 2322 resulting in the stack die package having, but not limited to, substantially vertical surfaces located near the leads 604 and 612 of the lead frame 604. In one embodiment, the package sawing process can automatically cut tie bars (e.g., 904) that were coupling the first clip (e.g., 616a) and the second clip (e.g., 616b). Consequently, the first clip and the second clip are separated, become functional, and are held in place by the molding (e.g., 642). Operation 2322 can be implemented in any manner similar to that described herein, but is not limited to such.

At operation 2324, electrical testing can be performed on the stack die package to determine whether it operates properly. It is pointed out that operation 2324 can be implemented in a wide variety of ways. For example, operation 2324 can be implemented in any manner similar to that described herein, but is not limited to such.

At operation 2326 of FIG. 23, tape and reel can be performed on the stack die package. Note that operation 2326 can be implemented in a wide variety of ways. For example, in an embodiment, the tape and reel at operation 2326 can include putting the stack die package into packing material to protect it during transportation to a desired location. Operation 2326 can be implemented in any manner similar to that described herein, but is not limited to such.

In various embodiments, it is noted that one or more of the solder pastes described herein can instead be implemented with a conductive epoxy or conductive adhesive, but are not limited to such. In addition, in an embodiment, operation 2318 may not be performed if solder paste is not utilized during method 2300.

It is pointed out that even though method 2300 was described with reference to fabricating a single stack die package, method 2300 can be modified in accordance with various embodiments of the invention to fabricate multiple stack die packages at substantially the same time.

FIG. 34 is a flow diagram of a method 3400 for fabricating one or more "double cooling" stack die packages in accordance with various embodiments of the invention. Although specific operations are disclosed in FIG. 34, such operations are examples. The method 3400 may not include all of the operations illustrated by FIG. 34. Also, method 3400 may include various other operations and/or variations of the operations shown. Likewise, the sequence of the operations of flow diagram 3400 can be modified. It is appreciated that not all of the operations in flow diagram 3400 may be performed. In various embodiments, one or more of the operations of method 3400 can be controlled or managed by software, by firmware, by hardware or by any combination thereof, but is not limited to such. Method 3400 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

In an embodiment, it is noted that before performing method 3400, operations 1202-1218 of method 1200 (FIG. 12) may be performed as described herein. For example, in an embodiment, after completion of operation 1218 of FIG. 12, method 3400 (FIG. 34) can be performed as described below. Additionally, in one embodiment, it is pointed out that before performing method 3400, operations 2302-2318 of method 2300 (FIG. 23) may be performed as described herein. For example, in an embodiment, after completion of operation 2318 of FIG. 23, method 3400 (FIG. 34) can be performed as described below.

Figure 35:
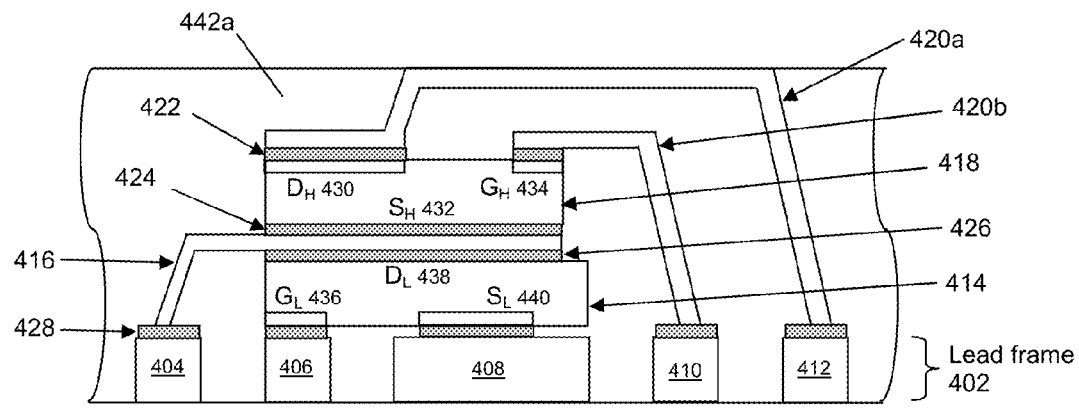
FIG. 35 is a side sectional view of a selected fabrication stage of a stack die package in accordance with various embodiments of the invention.
Figure 36:
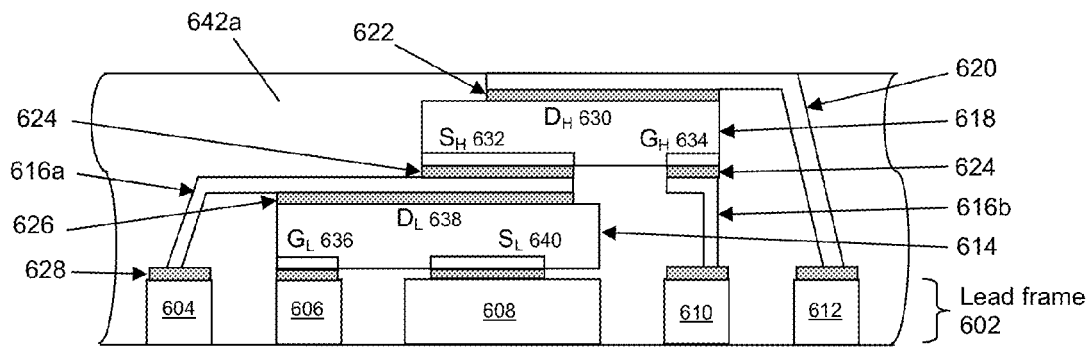
FIG. 36 is a side sectional view of a selected fabrication stage of another stack die package in accordance with various embodiments of the invention.

At operation 3402, the stack die assembly (e.g., as shown in FIG. 20 or FIG. 31) can be covered or encapsulated by a molding compound or material except for at least a portion of a top or upper surface of an upper clip (e.g., 420a or 620) of the stack die assembly. After operation 3402, in an embodiment, at least a portion of the top surface of the upper clip can be free of the molding compound or material. It is noted that operation 3402 can be implemented in a wide variety of ways. For example, in an embodiment, FIG. 35 illustrates a side sectional view of the stack die assembly of FIG. 20 covered or encapsulating at operation 3402 by a molding compound or material 442a except for at least a portion of a top or upper surface of the upper clip 420a. In addition, in one embodiment, FIG. 36 illustrates a side sectional view of the stack die assembly of FIG. 31 covered or encapsulating at operation 3402 by a molding compound or material 642a except for at least a portion of a top or upper surface of the upper clip 620. Furthermore, FIG. 7 illustrates the stack die package 600a that as part of its fabrication process, in an embodiment, could have been involved with the molding process of operation 3402 wherein the molding 642a covers or encapsulates the stack die assembly except for at least a portion of the top or upper surface of the upper clip 620.

In an embodiment, it is noted that a "double cooling" molding tool can be utilized at operation 3402 that has a lower cavity height than a molding tool typically utilized to completely encapsulate the stack die assembly as shown in FIG. 21 or FIG. 32. In addition, a top mold surface of the "double cooling" molding tool is capable of touching or contacting the top or upper surface of the upper clip (e.g., 420a or 620) of the stack die assembly at operation 3402. Furthermore, with a soft or flexible film located between the top mold and the upper surface of the clip at operation 3402, at least a portion of the upper surface of the clip can remain free of the molding compound while the remainder of the stack die assembly is covered or encompassed by the molding compound at operation 3402. In an embodiment, the molding process at operation 3402 can be referred to as Film Assisted Molding, but is not limited to such. Operation 3402 can be implemented in any manner similar to that described herein, but is not limited to such.

At operation 3404 of FIG. 34, a determination can be made as to whether or not to plate the exposed top surface of the upper clip with one or more metals. If not, method 3400 can proceed to operation 3408. However, if it is determined at operation 3404 that the exposed top surface of the upper clip is to be plated with one or more metals, method 3400 can proceed to operation 3406. It is noted that operation 3404 can be implemented in a wide variety of ways. For example, in an embodiment, it may be decided at operation 3404 to plate the exposed top surface of the upper clip with one or more metals in order to later solder the upper surface of the clip to a heatsink. Alternatively, in an embodiment, it may be decided at operation 3404 not to plate the exposed top surface of the upper clip with one or more metals since there is no desire to solder the upper surface of the clip to a heatsink. In addition, in an embodiment, it may be decided at operation 3404 not to plate the exposed top surface of the upper clip with one or more metals to avoid a later process (e.g., printed circuit board reflow process) from possibly melting the plating and obscuring laser markings implemented within the top surface (e.g., of the molding compound) of the stack die package. Operation 3404 can be implemented in any manner similar to that described herein, but is not limited to such.

At operation 3406, the exposed top surface of the clip of the stack die package can be plated with, but is not limited to, one or more metals (e.g., tin) to produce an exposed plated pad (e.g., 706). Note that operation 3406 can be implemented in a wide variety of ways. For example, in an embodiment, FIG. 7 illustrates the top surface of the upper clip 620 tin-plated resulting in the formation of an exposed tin-plated pad 706 on the top surface of the upper clip 620. Operation 3406 can be implemented in any manner similar to that described herein, but is not limited to such. In this manner, the "double cooling" can be achieved by heat escaping the stack die package via its lead frame and heat escaping via its exposed plated pad.

At operation 3408 of FIG. 34, the exposed top surface of the upper clip of the stack die package is prevented from being plated during a plating process (e.g., using one or more metals) of the stack die package. It is pointed out that operation 3408 can be implemented in a wide variety of ways. For example, in an embodiment, a film can be applied on or over the top side of the stack die package at operation 3408 to prevent the exposed top surface of the upper clip from being plated during a plating process of the stack die package. Operation 3408 can be implemented in any manner similar to that described herein, but is not limited to such.

In an embodiment, it is noted that after performing operation 3406 or 3408 of method 3400, operations 1222-1226 of method 1200 (FIG. 12) may be performed as described herein. Furthermore, in one embodiment, note that after performing operation 3406 or 3408 of method 3400, operations 2322-2326 of method 2300 (FIG. 23) may be performed as described herein.

It is pointed out that even though method 3400 of FIG. 34 was described with reference to fabricating a single "double cooling" stack die package, method 3400 can be modified in accordance with various embodiments of the invention to fabricate multiple "double cooling" stack die packages at substantially the same time.

Figure 37:
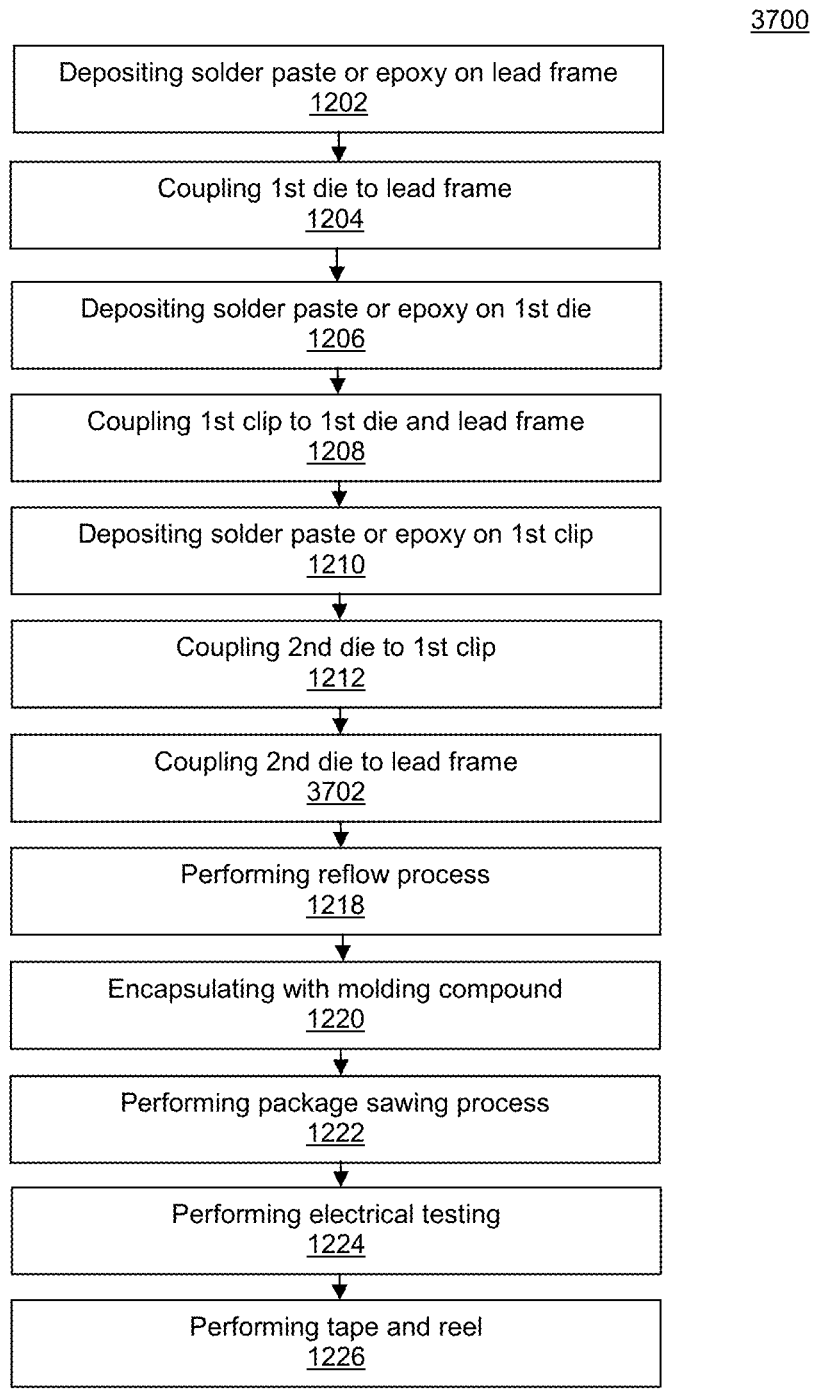
FIG. 37 is a flow diagram of still another method in accordance with various embodiments of the invention.

FIG. 37 is a flow diagram of a method 3700 for fabricating one or more stack die packages in accordance with various embodiments of the invention. Although specific operations are disclosed in FIG. 37, such operations are examples. The method 3700 may not include all of the operations illustrated by FIG. 37. Also, method 3700 may include various other operations and/or variations of the operations shown. Likewise, the sequence of the operations of flow diagram 3700 can be modified. It is appreciated that not all of the operations in flow diagram 3700 may be performed. In various embodiments, one or more of the operations of method 3700 can be controlled or managed by software, by firmware, by hardware or by any combination thereof, but is not limited to such. Method 3700 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 38:
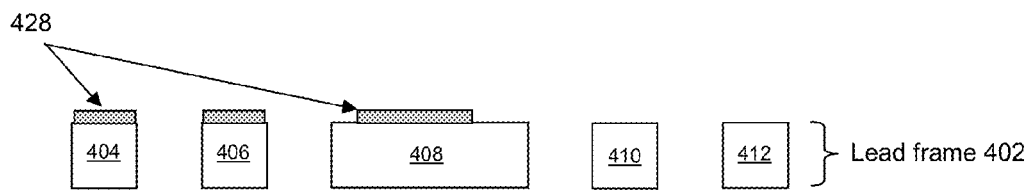
FIGS. 38, 39, and 40 are side sectional views of selected fabrication stages of a stack die package in accordance with various embodiments of the invention.

At operation 1202 of FIG. 37, solder paste (e.g., 428) or epoxy can be deposited onto a lead frame (e.g., 402). It is noted that operation 1202 can be implemented in a wide variety of ways. For example, in one embodiment, FIG. 38 illustrates a side sectional view of solder paste 428 (or epoxy) dispensed or printed onto the leads 404, 406, and 408 of the lead frame 402 at operation 1202, but is not limited to such. Note that at operation 1202, solder paste or epoxy can be deposited onto one or more of the leads (e.g., 404-412) of a lead frame (e.g., 402). Operation 1202 can be implemented in any manner similar to that described herein, but is not limited to such.

In an embodiment, it is noted that after performing operation 1202 of method 3700, operations 1204-1212 of method 3700 may be performed as described herein with reference to FIG. 12, but are not limited to such.

Figure 39:
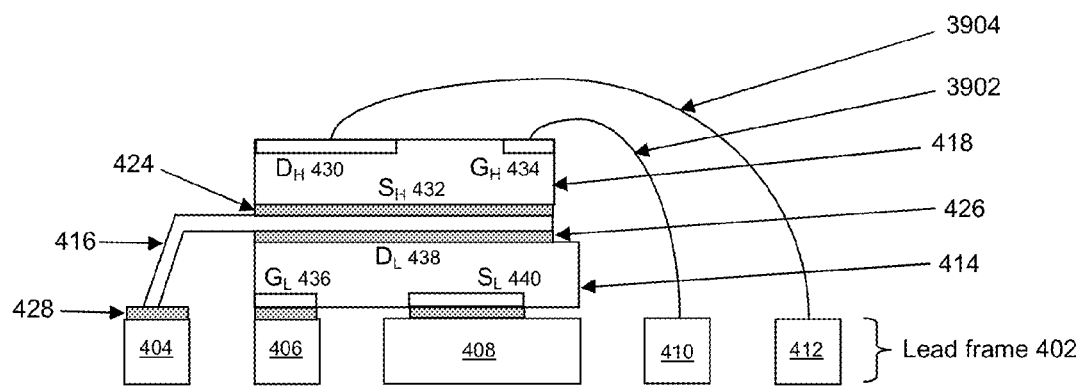

At operation 3702 of FIG. 37, the second die or chip (e.g., 418) can be coupled or attached to the lead frame. It is pointed out that operation 3702 can be implemented in a wide variety of ways. For example, in an embodiment, FIG. 39 illustrates a wire 3904 coupled or attached to the drain contact 430 of the upper die 418 and the lead 412 of the lead frame 402 at operation 3702. In addition, FIG. 39 illustrates a wire 3902 coupled or attached to the gate contact 434 of the upper die 418 and the lead 410 of the lead frame 402 at operation 3702. In an embodiment, it is pointed out that at operation 3702, the wires 3902 and 3904 can be coupled or attached to the second die and the lead frame via wire bonding, but are not limited to such. In an embodiment, note that the second die or chip can be coupled or attached to the lead frame at operation 3702 utilizing, but not limited to, one or more wires, one or more clips, any combination of one or more wires and one or more clips, etc. Operation 3702 can be implemented in any manner similar to that described herein, but is not limited to such.

Figure 40:
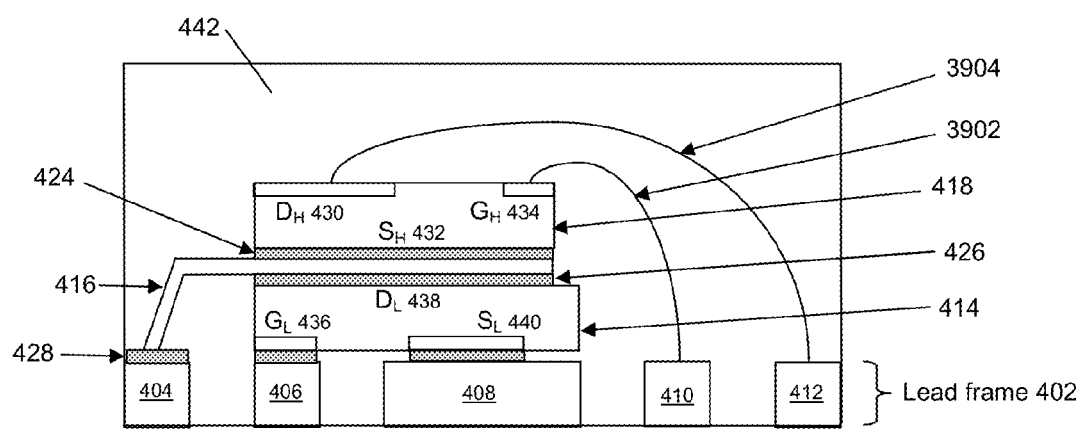

In an embodiment, note that after performing operation 3702 of method 3700, operations 1218-1226 of method 3700 may be performed as described herein with reference to FIG. 12, but are not limited to such. It is pointed out that at operation 1222 of method 3700, a package sawing process or operation can be performed on the stack die assembly covered with the molding compound or material. It is noted that operation 1222 can be implemented in a wide variety of ways. For example, in an embodiment, FIG. 40 illustrates the occurrence of a package sawing process at operation 1222 resulting in the stack die package having, but not limited to, substantially vertical surfaces located near the leads 404 and 412 of the lead frame 402. Operation 1222 can be implemented in any manner similar to that described herein, but is not limited to such.

It is pointed out that even though method 3700 of FIG. 37 was described with reference to fabricating a single stack die package, method 3700 can be modified in accordance with various embodiments of the invention to fabricate multiple stack die packages at substantially the same time.

Figure 41:
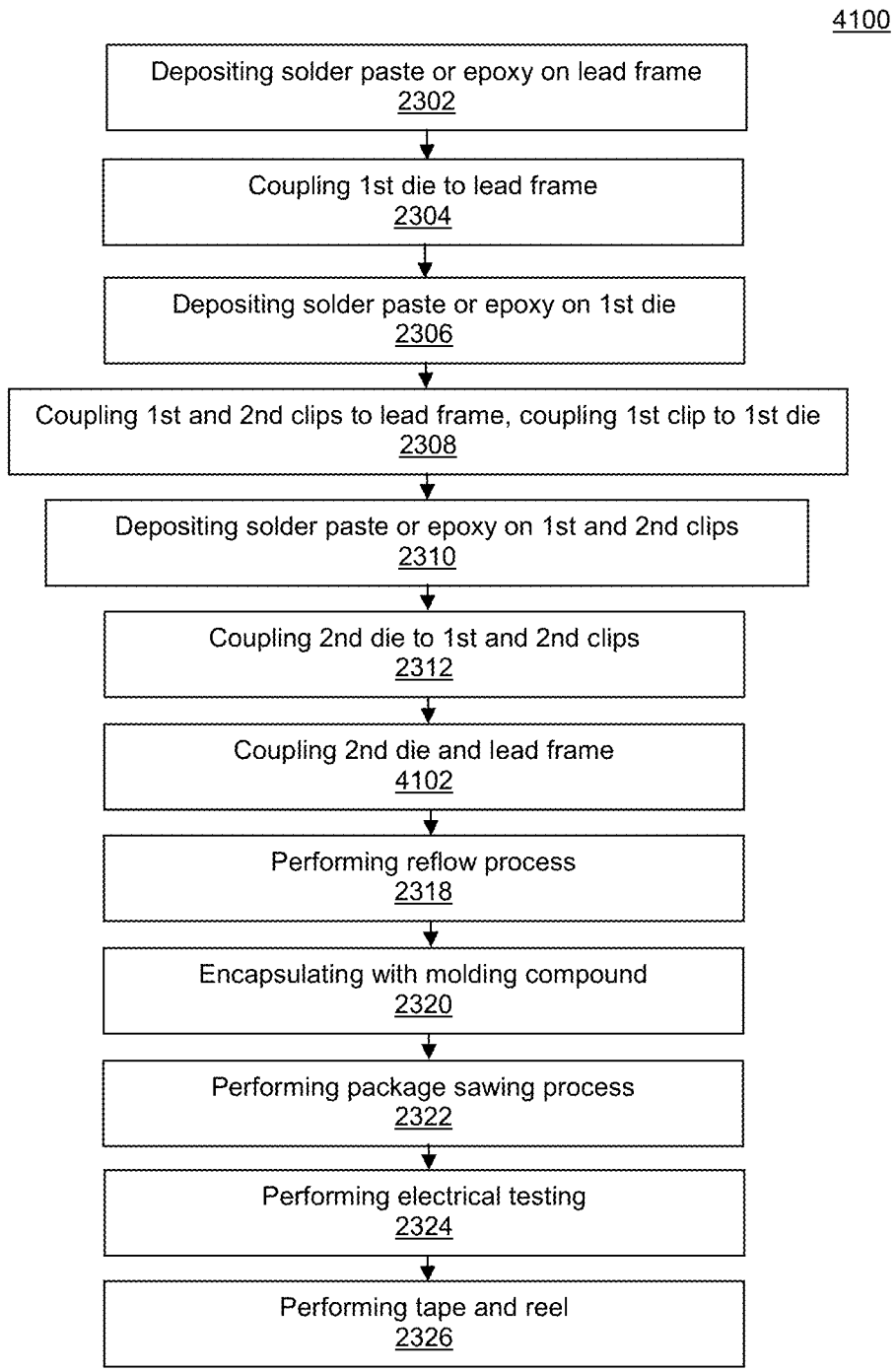
FIG. 41 is a flow diagram of another method in accordance with various embodiments of the invention.

FIG. 41 is a flow diagram of a method 4100 for fabricating one or more stack die packages in accordance with various embodiments of the invention. Although specific operations are disclosed in FIG. 41, such operations are examples. The method 4100 may not include all of the operations illustrated by FIG. 41. Also, method 4100 may include various other operations and/or variations of the operations shown. Likewise, the sequence of the operations of flow diagram 4100 can be modified. It is appreciated that not all of the operations in flow diagram 4100 may be performed. In various embodiments, one or more of the operations of method 4100 can be controlled or managed by software, by firmware, by hardware or by any combination thereof, but is not limited to such. Method 4100 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 42:
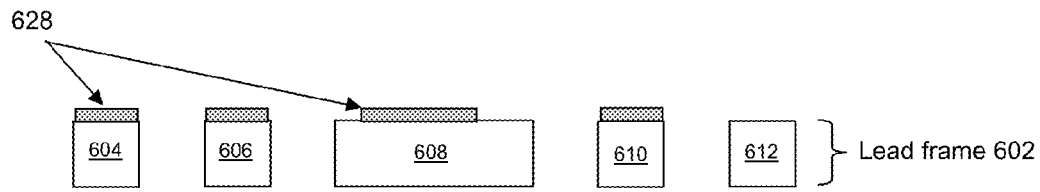
FIGS. 42, 43, and 44 are side sectional views of selected fabrication stages of a stack die package in accordance with various embodiments of the invention.

At operation 2302 of FIG. 41, solder paste (e.g., 628) or epoxy can be deposited onto a lead frame (e.g., 602). It is noted that operation 2302 can be implemented in a wide variety of ways. For example, in one embodiment, FIG. 42 illustrates a side sectional view of solder paste 628 (or epoxy) dispensed or printed onto the leads 604, 606, 608, and 610 of the lead frame 602 at operation 2302, but is not limited to such. Note that at operation 2302, solder paste or epoxy can be deposited onto one or more of the leads (e.g., 604-612) of a lead frame (e.g., 602). Operation 2302 can be implemented in any manner similar to that described herein, but is not limited to such.

In an embodiment, it is noted that after performing operation 2302 of method 4100, operations 2304-2312 of method 4100 may be performed as described herein with reference to FIG. 23, but are not limited to such.

Figure 43:
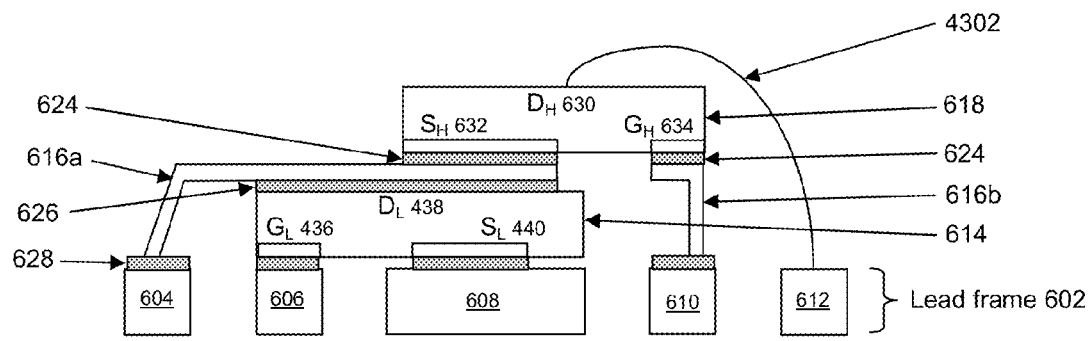

At operation 4102 of FIG. 41, the second die or chip (e.g., 618) can be coupled or attached to the lead frame. It is pointed out that operation 4102 can be implemented in a wide variety of ways. For example, in an embodiment, FIG. 43 illustrates a wire 4302 coupled or attached to the drain contact 630 of the upper die 618 and the lead 612 of the lead frame 602 at operation 4102. In an embodiment, it is pointed out that at operation 4102, the wire 4302 can be coupled or attached to the second die and the lead frame via wire bonding, but is not limited to such. In an embodiment, note that the second die or chip can be coupled or attached to the lead frame at operation 4102 utilizing, but not limited to, one or more wires, one or more clips, any combination of one or more wires and one or more clips, etc. Operation 4102 can be implemented in any manner similar to that described herein, but is not limited to such.

Figure 44:
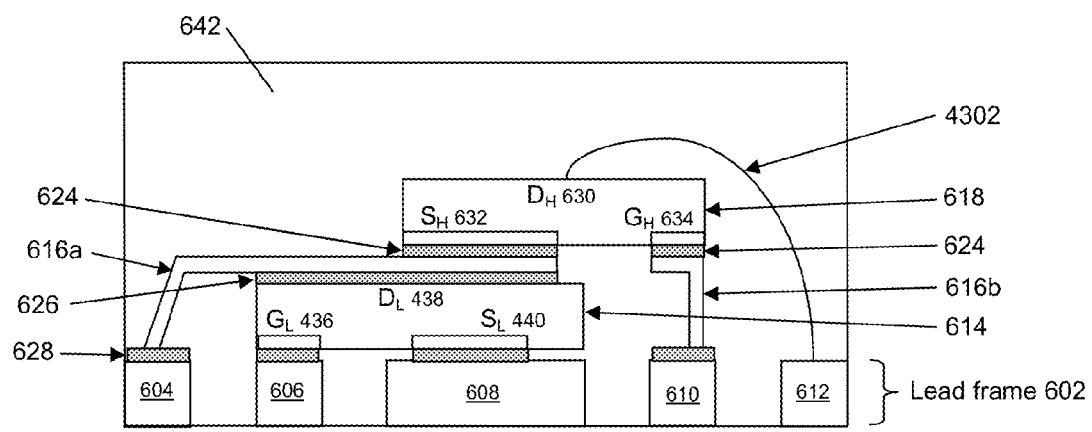

In an embodiment, note that after performing operation 4102 of method 4100, operations 2318-2326 of method 4100 may be performed as described herein with reference to FIG. 23, but are not limited to such. It is pointed out that at operation 2322 of method 3700, a package sawing process or operation can be performed on the stack die assembly covered with the molding compound or material. It is noted that operation 2322 can be implemented in a wide variety of ways. For example, in an embodiment, FIG. 44 illustrates the occurrence of a package sawing process at operation 2322 resulting in the stack die package having, but not limited to, substantially vertical surfaces located near the leads 604 and 612 of the lead frame 602. Operation 2322 can be implemented in any manner similar to that described herein, but is not limited to such.

It is pointed out that even though method 4100 of FIG. 41 was described with reference to fabricating a single stack die package, method 4100 can be modified in accordance with various embodiments of the invention to fabricate multiple stack die packages at substantially the same time.

In various embodiments, it is noted that one or more of the solder pastes described herein can instead be implemented with a conductive epoxy or conductive adhesive, but are not limited to such.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method comprising:
    coupling a gate and a source of a first die to a lead frame, said first die comprising said gate and said source that are located on a first surface of said first die and a drain that is located on a second surface of said first die that is opposite said first surface, said first die comprising trench gate technology;
    coupling a source of a second die to said drain of said first die, said second die comprising a gate and said source that are located on a first surface of said second die and a drain that is located on a second surface of said second die that is opposite said first surface;
    coupling a first clip to said lead frame and said drain of said second die;
    coupling a second clip to said lead frame and said gate of said second die, said second clip comprising a first platform and a second platform, said first platform coupled to said gate of said second die and said second platform overlaps a portion of said lead frame coupled to said source of said first die;
    performing a molding process comprising covering said first die, second die, first clip, and second clip with a molding material, said molding process comprises using a flexible film so a portion of an upper surface of said first clip is free of said molding material, said molding process further comprises using a molding tool comprising a mold surface capable of contacting said upper surface of said first clip; and
    using a film to prevent said portion of said upper surface of said first clip from being plated during a plating process, said portion of said upper surface of said first clip is exposed in final package.

2. The method of claim 1, wherein said coupling said second clip to said lead frame and said gate of said second die comprises using conductive epoxy.

3. The method of claim 1, wherein said coupling said first clip occurs after said coupling said source of said second die.

4. The method of claim 1, wherein said second die comprising trench gate technology.

5. The method of claim 1, further comprising:
coupling a third clip to said lead frame, said drain of said first die, and to said source of said second die.

6. The method of claim 5, wherein said coupling said third clip to said lead frame, said drain of said first die, and to said source of said second die comprises using conductive epoxy.

7. The method of claim 5, wherein a portion of said third clip is located between said first die and said second die.

8. The method of claim 1, wherein said coupling said gate and said source of said first die to said lead frame comprises using conductive epoxy.

9. A method comprising:
coupling a gate and a source of a first die to a lead frame with solder paste, said first die comprising said gate and said source that are located on a first surface of said first die and a drain that is located on a second surface of said first die that is opposite said first surface, said first die comprising split gate technology;
coupling a source of a second die to said drain of said first die, said second die comprising a gate and said source that are located on a first surface of said second die and a drain that is located on a second surface of said second die that is opposite said first surface;
coupling a first clip to said lead frame and said drain of said second die with solder paste;
coupling a second clip to said lead frame and said gate of said second die, said second clip comprising a first platform and a second platform, said first platform coupled to said gate of said second die and said second platform overlaps a portion of said lead frame coupled to said source of said first die;
performing a molding process comprising covering said first die, second die, first clip, and second clip with a molding material, said molding process comprises using a flexible film so a portion of an upper surface of said first clip is free of said molding material, said molding process further comprises using a molding tool comprising a mold surface capable of contacting said upper surface of said first clip; and
using a film to prevent said portion of said upper surface of said first clip from being plated during a plating process, said portion of said upper surface of said first clip is exposed in final package.

10. The method of claim 9, wherein said coupling said second clip to said lead frame and said gate of said second die comprises using solder paste.

11. The method of claim 9, further comprising:
coupling a third clip to said lead frame and said drain of said first die.

12. The method of claim 11, further comprising:
coupling said source of said second die to said third clip.

13. The method of claim 9, wherein said coupling said first clip occurs after said coupling said source of said second die.

14. The method of claim 9, wherein said second die comprises trench gate technology.

15. A method comprising:
coupling a gate and a source of a first die to a lead frame, said first die comprising said gate and said source that are located on a first surface of said first die and a drain that is located on a second surface of said first die that is opposite said first surface, said first die comprising split gate technology;
coupling a first clip to said lead frame and drain of said first die;
coupling a second clip to said lead frame;
coupling a source of a second die to said first clip;
coupling a gate of said second die to said second clip, said second die comprising said gate and said source that are located on a first surface of said second die and a drain that is located on a second surface of said second die that is opposite said first surface, said second die comprising split gate technology, said second clip comprising a first platform and a second platform, said first platform coupled to said gate of said second die and said second platform overlaps a portion of said lead frame coupled to said source of said first die;
coupling a third clip to said lead frame and said drain of said second die;
performing a molding process comprising covering said first die, second die, first clip, second clip, and third clip with a molding material, said molding process comprises using a flexible film so a portion of an upper surface of said third clip is free of said molding material, said molding process further comprises using a molding tool comprising a mold surface capable of contacting said upper surface of said third clip; and
using a film to prevent said portion of said upper surface of said third clip from being plated during a plating process, said portion of said upper surface of said third clip is exposed in final package.

16. The method of claim 15, wherein said coupling said third clip to said lead frame and said drain of said second die comprises using conductive epoxy.

17. The method of claim 15, wherein a portion of said first clip is located between said first die and said second die.

18. The method of claim 15, wherein said first clip, second clip, and third clip each comprises an electrically conductive material.

19. The method of claim 15, wherein said coupling said gate and said source of said first die to said lead frame comprises using solder paste.

20. The method of claim 15, wherein said coupling said gate and said source of said first die to said lead frame comprises using conductive adhesive.

* * * * *